United States Patent
Chung et al.

(10) Patent No.: US 11,823,960 B2
(45) Date of Patent: *Nov. 21, 2023

(54) METHOD FOR FORMING SEMICONDUCTOR STRUCTURE WITH HIGH ASPECT RATIO

(71) Applicant: Taiwan Semiconductor Manufacturing Company, Ltd., Hsinchu (TW)

(72) Inventors: Han-Pin Chung, Kaohsiung (TW); Chih-Tang Peng, Zhubei (TW); Tien-I Bao, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 335 days.

This patent is subject to a terminal disclaimer.

(21) Appl. No.: 17/079,787

(22) Filed: Oct. 26, 2020

(65) Prior Publication Data

US 2021/0043523 A1    Feb. 11, 2021

Related U.S. Application Data

(63) Continuation of application No. 16/047,115, filed on Jul. 27, 2018, now Pat. No. 10,840,154.
(Continued)

(51) Int. Cl.
*H01L 21/8238* (2006.01)
*H01L 21/762* (2006.01)
(Continued)

(52) U.S. Cl.
CPC .. *H01L 21/823878* (2013.01); *H01L 21/0223* (2013.01); *H01L 21/02252* (2013.01); *H01L 21/02255* (2013.01); *H01L 21/02271* (2013.01); *H01L 21/76229* (2013.01); *H01L 21/823431* (2013.01); *H01L 21/823481* (2013.01);
(Continued)

(58) Field of Classification Search
CPC ......... H01L 21/823878; H01L 21/0223; H01L 21/02252; H01L 21/02255; H01L 21/02271; H01L 21/76229; H01L 21/823821; H01L 27/0924; H01L 29/66545
See application file for complete search history.

(56) References Cited

U.S. PATENT DOCUMENTS 8,836,016 B2    9/2014  Wu et al.
8,841,701 B2    9/2014  Lin et al.
(Continued)

*Primary Examiner* — Dale E Page
*Assistant Examiner* — Quovaunda Jefferson
(74) *Attorney, Agent, or Firm* — McClure, Qualey & Rodack, LLP

(57) ABSTRACT

A semiconductor structure and a method for forming the same are provided. The method includes forming a first protruding structure, a second protruding structure, and a third protruding structure over a substrate. The method also includes performing a depositing process to form a first insulation material layer between the first protruding structure and the second protruding structure. The method further includes performing a first insulation material conversion process onto the first insulation material layer to bend the first protruding structure and the second protruding structure toward opposite directions.

20 Claims, 30 Drawing Sheets

Related U.S. Application Data

(60) Provisional application No. 62/591,272, filed on Nov. 28, 2017.

(51) Int. Cl.

| | | |
|---|---|---|
| *H01L 21/02* | (2006.01) | |
| *H01L 27/092* | (2006.01) | |
| *H01L 29/78* | (2006.01) | |
| *H01L 21/8234* | (2006.01) | |
| *H01L 29/66* | (2006.01) | |
| *H01L 21/84* | (2006.01) | |
| *H01L 29/417* | (2006.01) | |

(52) U.S. Cl.
CPC .. *H01L 21/823821* (2013.01); *H01L 27/0924* (2013.01); *H01L 29/66545* (2013.01); *H01L 29/7846* (2013.01); *H01L 21/0234* (2013.01); *H01L 21/02323* (2013.01); *H01L 21/02337* (2013.01); *H01L 21/02348* (2013.01); *H01L 21/845* (2013.01); *H01L 29/41791* (2013.01); *H01L 29/7843* (2013.01)

(56) References Cited

U.S. PATENT DOCUMENTS

| | | |
|---|---|---|
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |
| 10,186,615 B2 | 1/2019 | Kim et al. |
| 10,840,154 B2 * | 11/2020 | Chung ................ H01L 29/7846 |
| 2014/0231919 A1 * | 8/2014 | Peng ..................... H01L 21/845 |
| | | 257/368 |
| 2015/0014807 A1 * | 1/2015 | Chuang ............... H01L 29/0649 |
| | | 438/430 |

* cited by examiner

METHOD FOR FORMING SEMICONDUCTOR STRUCTURE WITH HIGH ASPECT RATIO

CROSS REFERENCE TO RELATED APPLICATIONS

This application is a Continuation application of U.S. patent application Ser. No. 16/047,115, filed on Jul. 27, 2018, now U.S. Pat. No. 10,840,154, the entirety of which is incorporated by reference herein. This application claims the benefit of U.S. Provisional Application No. 62/591,272 filed on Nov. 28, 2017, the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Despite groundbreaking advances in materials and fabrication, scaling planar devices such as the metal-oxide-semiconductor field effect transistor (MOSFET) device has proven challenging. To overcome these challenges, circuit designers look to novel structures to deliver improved performance, which has resulted in the development of three-dimensional designs, such as fin-like field effect transistors (FinFETs). The FinFET is fabricated with a thin vertical "fin" (or fin structure) extending up from a substrate. The channel of the FinFET is formed in this vertical fin. A gate is provided over the fin to allow the gate to control the channel from multiple sides. Advantages of the FinFET may include a reduction of the short channel effect, reduced leakage, and higher current flow.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
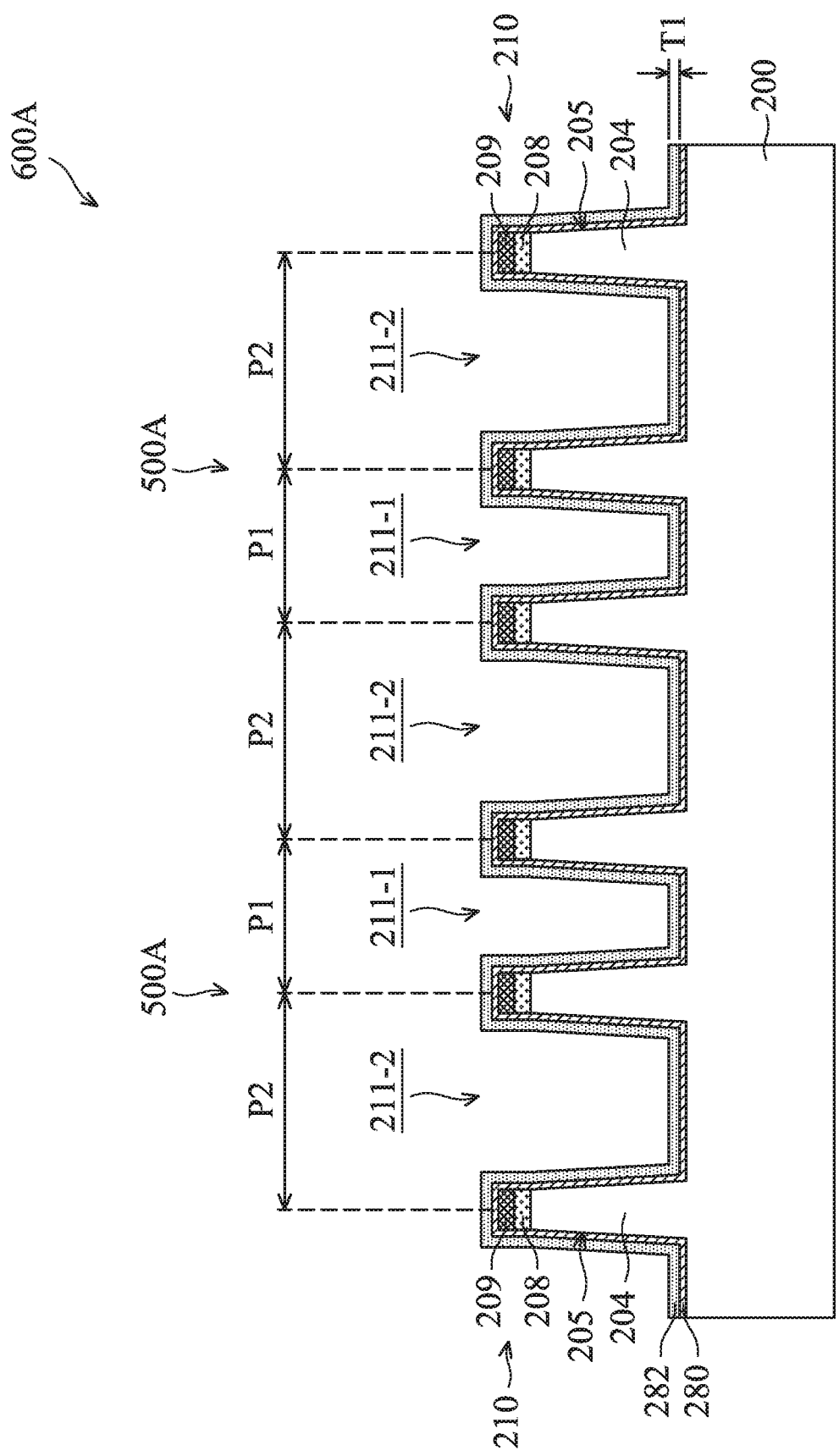
FIG. 1, FIG. 2, FIG. 3, FIG. 4, FIG. 5, FIG. 6, FIG. 7, FIG. 8, FIG. 9 and FIG. 10 are cross-sectional views showing various stages of a method of forming a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments of a semiconductor structure and a method for forming the same are provided. An insulation material layer may be formed over a space between two protruding structures in a semiconductor structure and an insulation material conversion process may be performed onto the insulation material layer. By performing insulation material conversion process, the protruding structures may be bent outwardly or inwardly to compensate the stress in subsequent manufacturing processes, so that the shape of the protruding structures may be adjusted and the performance of the resulting semiconductor structure may therefore be improved. The protruding structures may be structures such as fin structures, gate structure, or the like.

FIG. 1, FIG. 2, FIG. 3, FIG. 4, FIG. 5, FIG. 6, FIG. 7, FIG. 8, FIG. 9 and FIG. 10 are cross-sectional views showing various stages of a method of forming a semiconductor structure 600A, in accordance with some embodiments. It should be noted that the cross-sectional views of the semiconductor structure are taken transversely with respect to the channel direction of the fin structure (e.g. a fin structure 204) of the semiconductor structure. FIG. 11A is a perspective view showing various stages of a process of forming a semiconductor structure 600A after performing the stage shown in FIG. 10. FIG. 11B is a cross-sectional view along line A-A' of FIG. 11A showing various stages of a process of forming a semiconductor structure 600A after performing the stage shown in FIG. 10. FIG. 11C is a cross-sectional view along line B-B' of FIG. 11A showing various stages of a process of forming a semiconductor structure 600A after performing the stage shown in FIG. 10.

In some embodiments, a gate-replacement (gate-last) process is employed to fabricate the semiconductor structure 600A, such as a fin field effect transistor (FinFET) structure. The semiconductor structure 600A includes a substrate 200 for FinFETs 500A formed thereon.

As shown in FIG. 1, the substrate 200 including fin structures 204 is received. In some embodiments, the substrate 200 may be a semiconductor substrate, such as a bulk semiconductor, a semiconductor-on-insulator (SOI) substrate, or the like, which may be doped (e.g. with a P-type or an N-type dopant) or undoped. The substrate 200 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 200 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In some embodiments, the substrate 200 may include silicon.

In some embodiments, the substrate 200 may be for forming P-type devices or N-type devices. For example, P-type devices may be P-type metal-oxide-semiconductor field-effect transistors (MOSFETs). N-type devices may be N-type MOSFETs. Therefore, the FinFETs 500 may be referred to as P-type FinFETs or N-type FinFET.

In some embodiments, the fin structures 204 are protruding portions of the substrate 200 (e.g., from a major surface of the substrate 200), as shown in FIG. 1 in accordance with some embodiments. In some embodiments, the fin structures 204 are formed by a patterning process using patterned masks 210 as etch masks. For example, each of the patterned masks 210 includes patterned pad oxide 208 and patterned pad nitride 209. Portions of the substrate 200, which are not covered by the patterned masks 210, may be removed to form trenches 211-1 and 211-2. The patterned pad oxide 208 and patterned pad nitride 209 may be formed over the substrate 200. The patterned pad oxide 208 may be formed of silicon oxide using a thermal oxidation process. The patterned pad nitride 209 may act as an adhesion layer pattern between the substrate 200 and the underlying patterned pad oxide 208. For example, the patterned pad nitride 209 is formed of silicon nitride, silicon oxynitride, silicon carbide, silicon carbonitride, the like, or a combination thereof, and may be formed using a low-pressure chemical vapor deposition (LPCVD) process or a plasma enhanced chemical vapor deposition (PECVD) process, as examples.

In some embodiments, the fin structures 204 may be arranged with different pitches. For example, some of the fin structures 204 separated form from each other by the trench 211-1 may be arranged by a first pitch P1. The first pitch P1 may be equal to the minimum (critical) spacing between the adjacent two fin structures defined in the design rule. In some embodiments, the first pitch P1 is in a range from about 20 nm to about 50 nm. Some of the fin structures 204A separated form from each other by the trench 211-2 may be arranged by a second pitch P2 that is different than the first pitch P1. The second pitch P2 may be greater than the first pitch P1. The trenches 211-1 and 211-2 may have different widths corresponding to the pitches (e.g., the pitches P1 and P2) of the fin structures 204. For example, the width of the trench 211-1 may be less than the width of the trench 211-2.

Figure 2:
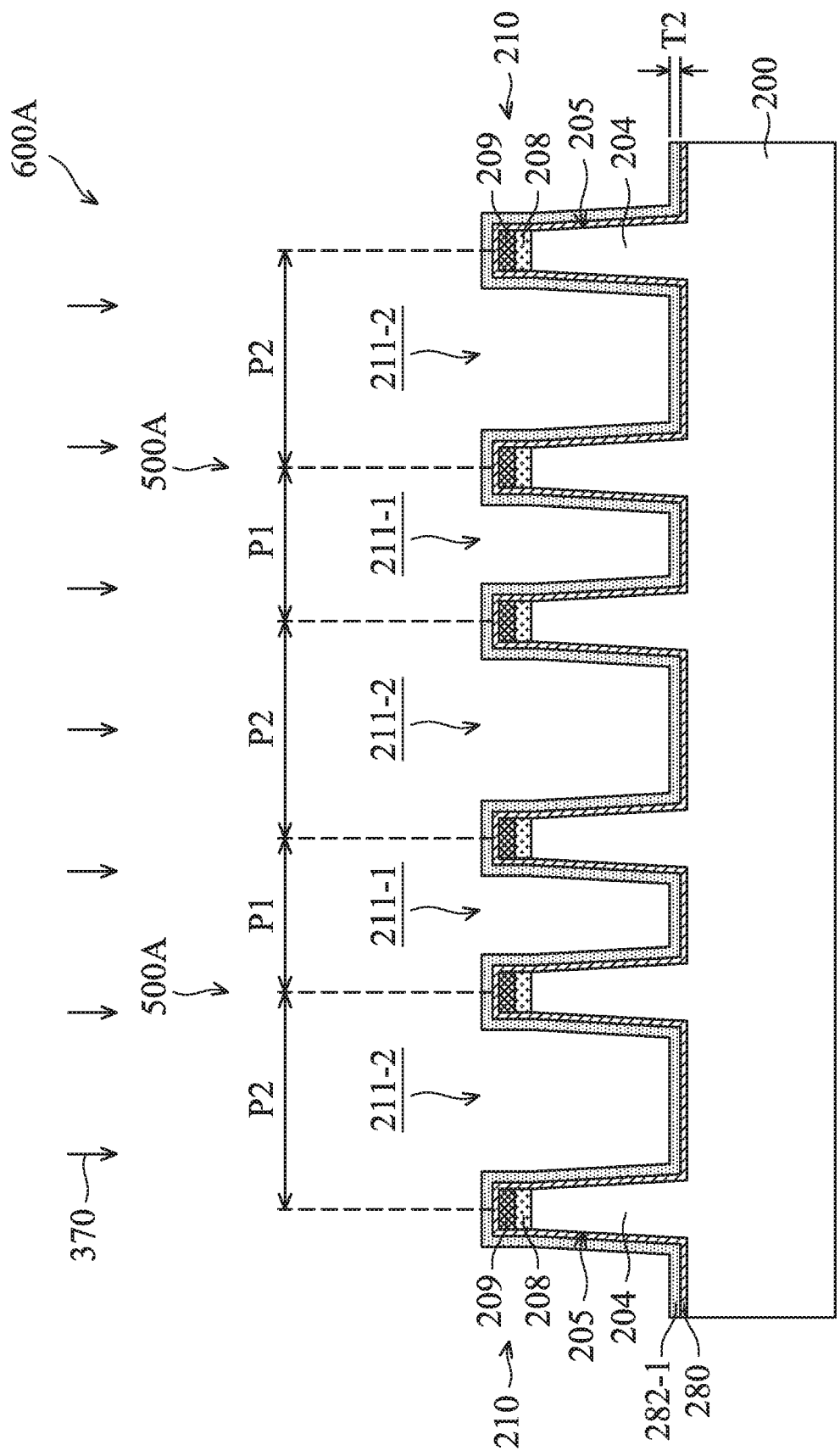

Afterwards, a liner layer 280 is formed lining sidewall surfaces 205 of the fin structures 204 (e.g., exposed from the mask 210), as shown in FIG. 2 in accordance with some embodiments. The liner layer 280 may be conformally formed over the fin structures 204. The liner layer 280 may comprise suitable dielectric material that reduces or prevents oxidization of the fin structure. In some embodiments, the liner layer 280 is formed of a nitride-containing material. For example, the liner layer 280 may be a single layer formed of silicon nitride or silicon oxynitride (e.g., $SiN_x$, SiON) or a multi layers including a silicon oxide layer and a silicon nitride and/or silicon oxynitride layer. In some embodiments, the liner layer 280 is formed by a deposition process including CVD, PVD, ALD, the like, or a combination thereof.

Afterwards, a first insulation material layer 282 is conformally formed over the fin structures 204, as shown in FIG. 1 in accordance with some embodiments. In some embodiments, the first insulation material layer 282 is formed in portions of the trenches 211-1 and 211-2 between the fin structures 204. In addition, the first insulation material layer 282 is formed conformally formed on the liner layer 280.

The first insulation material layer 282 may be formed of, for example, silicon dioxide formed by LPCVD (low pressure chemical vapor deposition), plasma-CVD or flowable CVD. In the flowable CVD, dielectric materials in flowable form are deposited. Flowable dielectric materials, as their name suggest, can flow during deposition to fill gaps or spaces with a high aspect ratio. Usually, various chemistries are added to silicon-containing precursors to allow the deposited film to flow. In some embodiments, nitrogen hydride bonds are added. In some embodiments, the flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydropolysilazane (PHPS), a tetraethyl orthosilicate (TEOS), or a silyl-amine, such as trisilylamine (TSA). For example, the flowable dielectric precursor used to form the first insulation material layer 282 may include perhydropolysilazane (PHPS) ($[H_2Si-NH]n$). In some embodiments, a thickness T1 of the first insulation material layer 282 is in a range from about 1 nm to about 5 nm.

As shown in FIG. 2, a pre-treatment process 370, for example, an ultraviolet (UV) light pre-treatment process, is performed on the first insulation material layer 282 (FIG. 1) to form a first treated insulation material layer 282-1 in accordance with some embodiments. The pre-treatment process 370 may be performed using a UV light source (e.g., a UV lamp). In addition, UV light (with wavelengths smaller than about 700 nm) irradiated form the UV light source used in the pre-treatment process 370 may help to break the Si—N bond and Si—H bond in the first insulation material layer 282 and promote the formation of Si—Si bond. In some embodiments, Si—Si bond is formed in the first treated insulation material layer 282-1 after performing the pre-treatment process 370. The volume of the first treated insulation material layer 282-1 may be smaller than the volume of the first insulation material layer 282. Therefore, a thickness T2 of the first treated insulation material layer 282-1 may be less than the thickness T1 of the first insulation material layer 282 (FIG. 1). For example, the thickness T2 of the first treated insulation material layer 282-1 may be in a range from about 0.5 nm to about 4.5 nm. In some embodiments, the pre-treatment process 370 may be performed for a time in a range from about 3 minutes to about 10 minutes, such as about 4 minutes.

Figure 3:
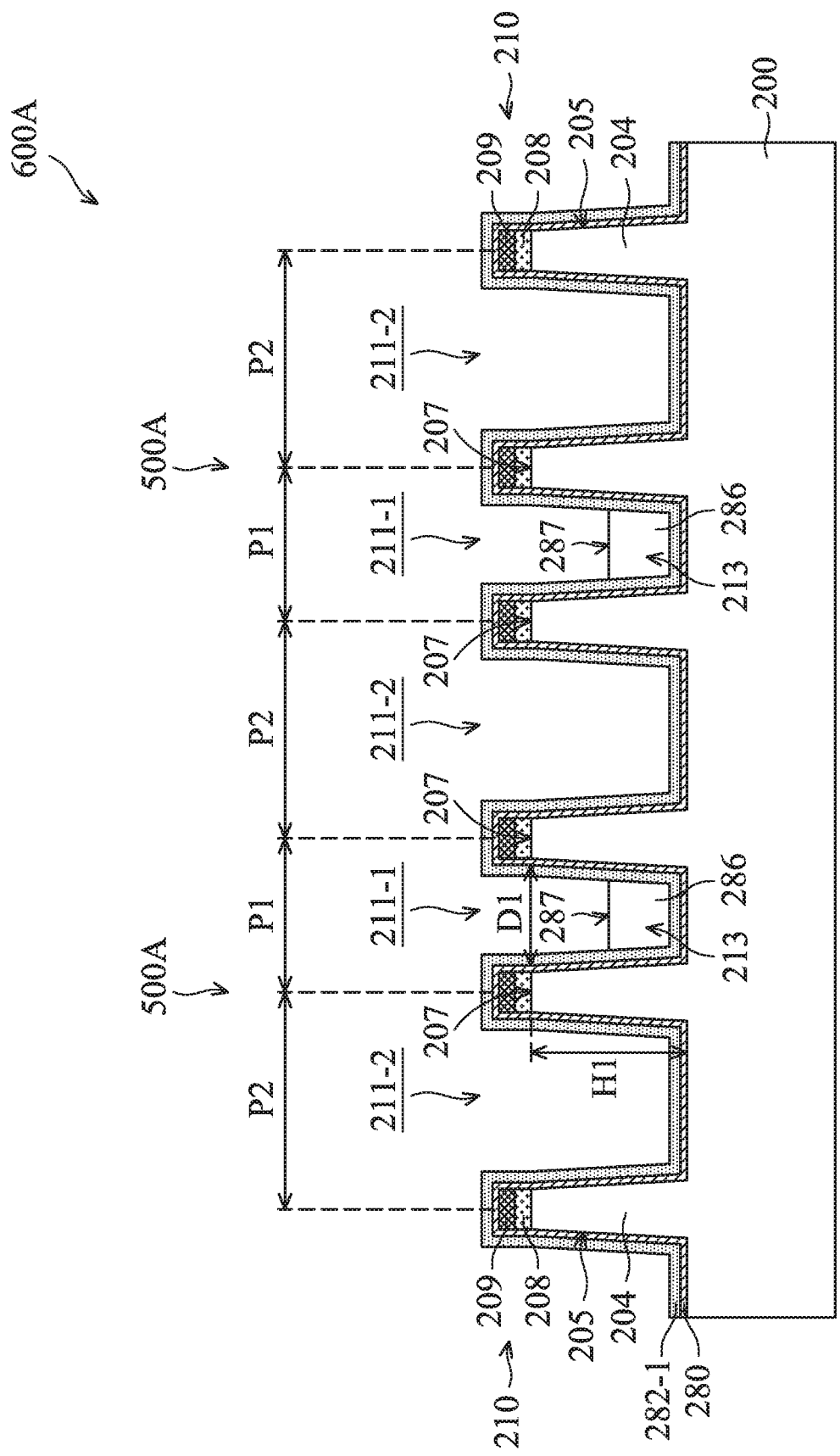

Afterwards, second insulation material layers 286 are formed covering a portion of the first treated insulation material layer 282-1 and filling bottom portions 213 of the trenches 211-1, as shown in FIG. 3 in accordance with some embodiments. In some embodiments, the second insulation material layers 286 are formed over the bottom portions of the sidewalls of the fin structures 204. In some embodiments, the materials and/or processes of the second insulation material layers 286 may be similar to, or the same as, those of the first insulation material layer 282. For example, the second insulation material layers 286 may be formed of, for example, silicon dioxide formed by a flowable CVD process.

Because the aspect ratio of the trenches 211-1 is higher than the aspect ratio of the trenches 211-2 (the width of the trench 211-1 is less than the width of the trench 211-2), the second insulation material layers 286 may be deposited to fill the trenches 211-1 prior than the trenches 211-2 by the flowable CVD process. Therefore, by controlling the process time of the flowable CVD process, it is possible to control the second insulation material layers 286 to fill a portion of each of the trenches 211-1 rather than portions of the trenches 211-2. In some embodiments, a top surface 287 of each of the second insulation material layers 286 is positioned lower than top surfaces 207 of the fin structures 204. In some embodiments, the top surface 287 of each of the second insulation material layers 286 is positioned between about one-third to about a quarter of the height H1 of each of the fin structures 204. In addition, the height H1 is a distance between the top surfaces 207 of the fin structures 204 and bottom surfaces of the trenches 211-1 (or the trenches 211-2).

Figure 4:
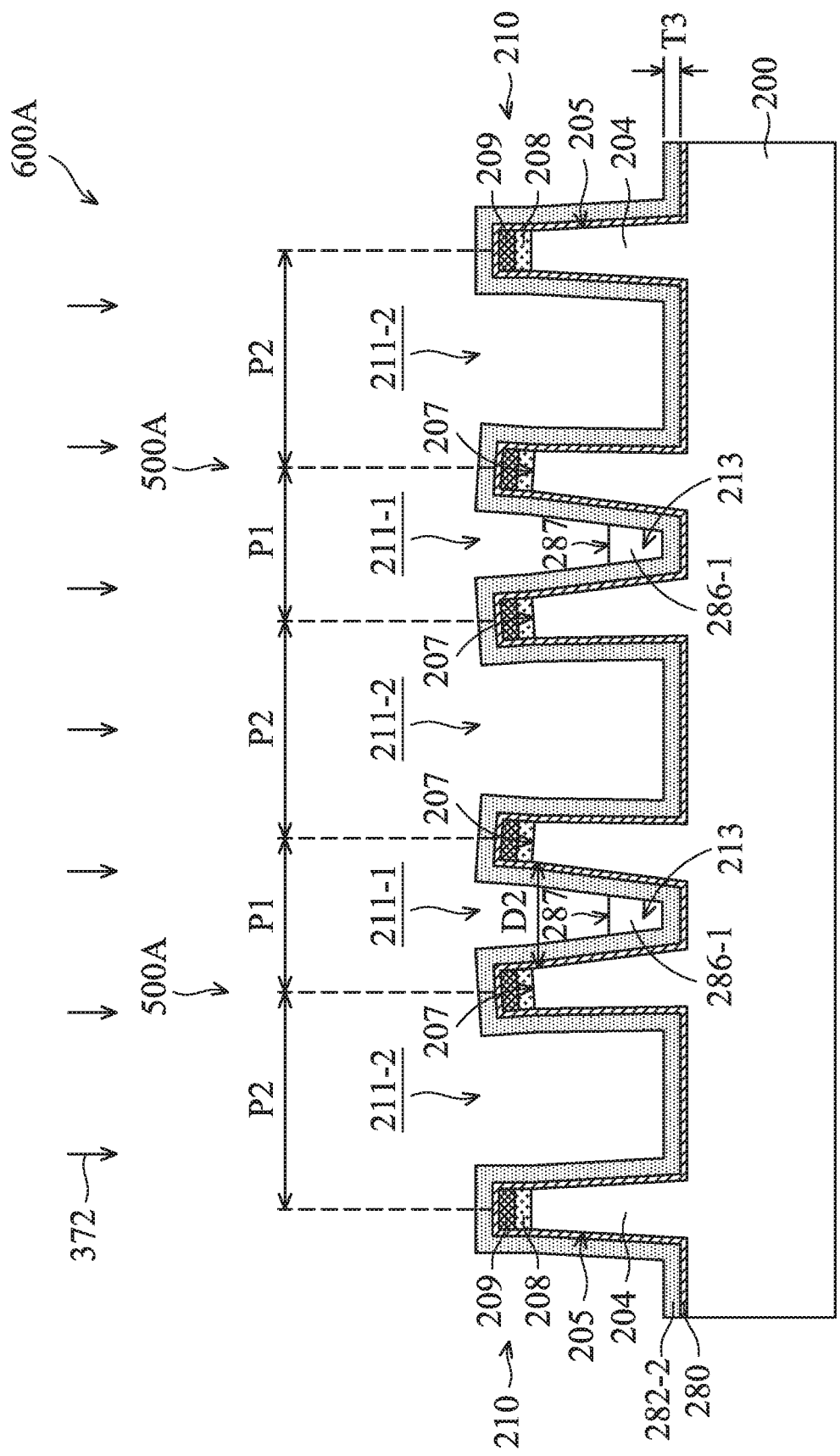

Afterwards, an insulation material conversion process 372 is performed on the first treated insulation material layer 282-1 and the second insulation material layer 286 (FIG. 3), as shown in FIG. 4 in accordance with some embodiments. The insulation material conversion process 372 may help to break the Si—Si bond in the first treated insulation material layer 282-1 and the Si—N bond and Si—H bond in the second insulation material layer 286. In addition, the insulation material conversion process 372 may convert the Si—Si bond, the Si—N bond and Si—H bond into Si—O bond. Therefore, the first treated insulation material layer 282-1 may be converted into a first converted insulation material layer 282-2 after performing the insulation material conversion process 372. Similarly, the second insulation material layers 286 may be converted into second converted insulation material layers 286-1. In addition, Si—O bond is formed in the first converted insulation material layer 282-2 and the second converted insulation material layers 286-1 after performing the insulation material conversion process 372. The volume of the first converted insulation material layer 282-2 may be expended after performing the insulation material conversion process 372. In some embodiments, the thickness T2 of the first treated insulation material layer 282-1 (FIG. 3) before performing the insulation material conversion process 372 is less than a thickness T3 of the first converted insulation material layer 282-2 after performing the insulation material conversion process 372. For example, the thickness T3 of the first converted insulation material layer 282-2 may be in a range from about 1 nm to about 5 nm. In addition, the second converted insulation material layers 286-1 may be densified after performing the insulation material conversion process 372.

After performing the insulation material conversion process 372, the first converted insulation material layer 282-2 may apply the outward bending force to the fin structures 204 beside the trenches 211-1 using the second converted insulation material layer 286-1 as the fulcrum. The outward bending force may bend the fin structures 204, so that the sidewall of the fin structure 204 may extend along different direction before and after the insulation material conversion process 372 is performed. In some embodiments, a sidewall of the fin structure 204 extends along a first direction before the insulation material conversion process 372 is performed and the sidewall of the fin structure 204 extends along a second direction different from the first direction after the insulation material conversion process 372 is performed. In some embodiments, the top surface 287 of each of the second insulation material layers 286 (FIG. 3) is positioned between about one-third to about a quarter of the height H1 of each of the fin structures 204. The trench 211-1 may have enough space to allow upper portions of the adjacent fin structures 204 bent outwardly by the tensile stress induced from the first converted insulation material layer 282-2 and the second converted insulation material layer 286-1. In some embodiments, a distance D1 (FIG. 3) between upper portions of the adjacent fin structures 204 before performing the insulation material conversion process 372 is different from a distance D2 (FIG. 4) between the upper portions of the adjacent fin structures 204 after performing the insulation material conversion process 372. Because the second converted insulation material layer 286-1 is positioned at the bottom portions 213 of the trenches 211-1, the distance D2, for example, may be greater than the distance D1.

In some embodiments, the insulation material conversion process 372 includes an anneal process or a plasma treatment process. For example, the anneal process may include a wet anneal process, such as a wet steam anneal process, and a subsequent dry anneal process. In some embodiments, the wet anneal process is a wet steam anneal process (e.g., a thermal anneal process performed in an environment including water steam) performed at a temperature in a range from about 400° C. to about 700° C., for a duration of about half hours to about four hours. For example, oxygen comes from the wet steam used during the wet anneal process may cause oxidation of the first treated insulation material layer 282-1 and the second insulation material layer 286. In addition, the dry anneal process is performed in an ambient atmosphere comprising nitrogen (e.g. $N_2$ gas), at a temperature in a range from about 600° C. to about 800° C., for a duration of about one hour to about two hours. For example, the plasma treatment process may include an inductively coupled plasma (ICP) treatment process. The ICP treatment process may be performed using a process gas including Ar, $O_2$, He, $H_2$, $NH_3$, etc.

Figure 5:
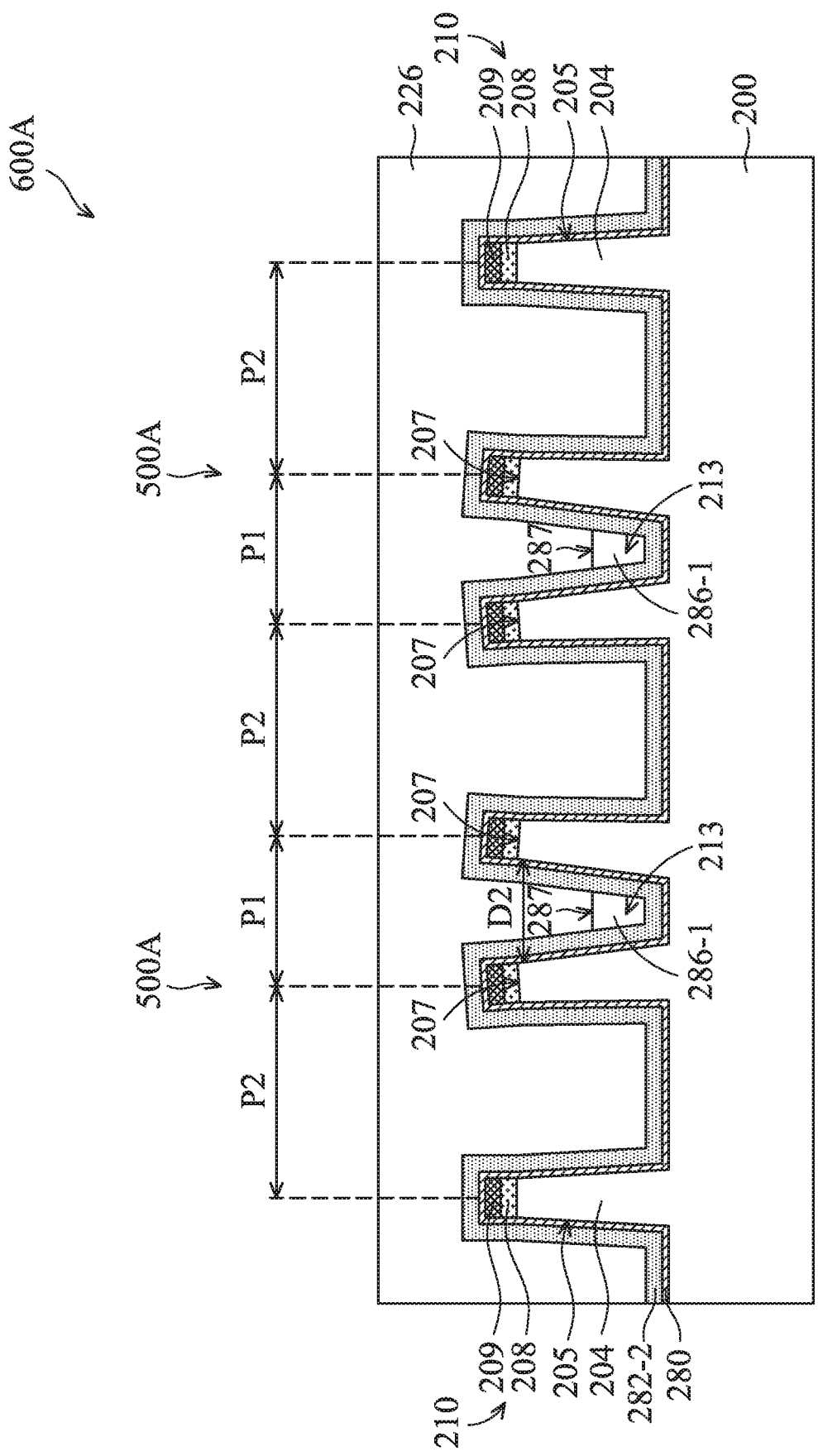

Afterwards, an insulation material 226 is formed covering the first converted insulation material layer 282-2 in the trenches 211-1 (FIG. 4), as shown in FIG. 5 in accordance with some embodiments. The insulation material 226 is entirely formed over the fin structures 204. In addition, the insulation material 226 is formed to fill the trenches 211-1 and 211-2 (FIG. 4), cover the fin structures 204, the liner layer 280, the first converted insulation material layer 282-2 and the second converted insulation material layer 286-1. The insulation material 226 may be formed of oxide, such as silicon oxide, a nitride, the like, or a combination thereof, and may be formed by high density plasma chemical vapor deposition (HDP-CVD), flowable CVD (FCVD), the like, or a combination thereof. Other insulation materials and/or other formation processes may be used.

Figure 6:
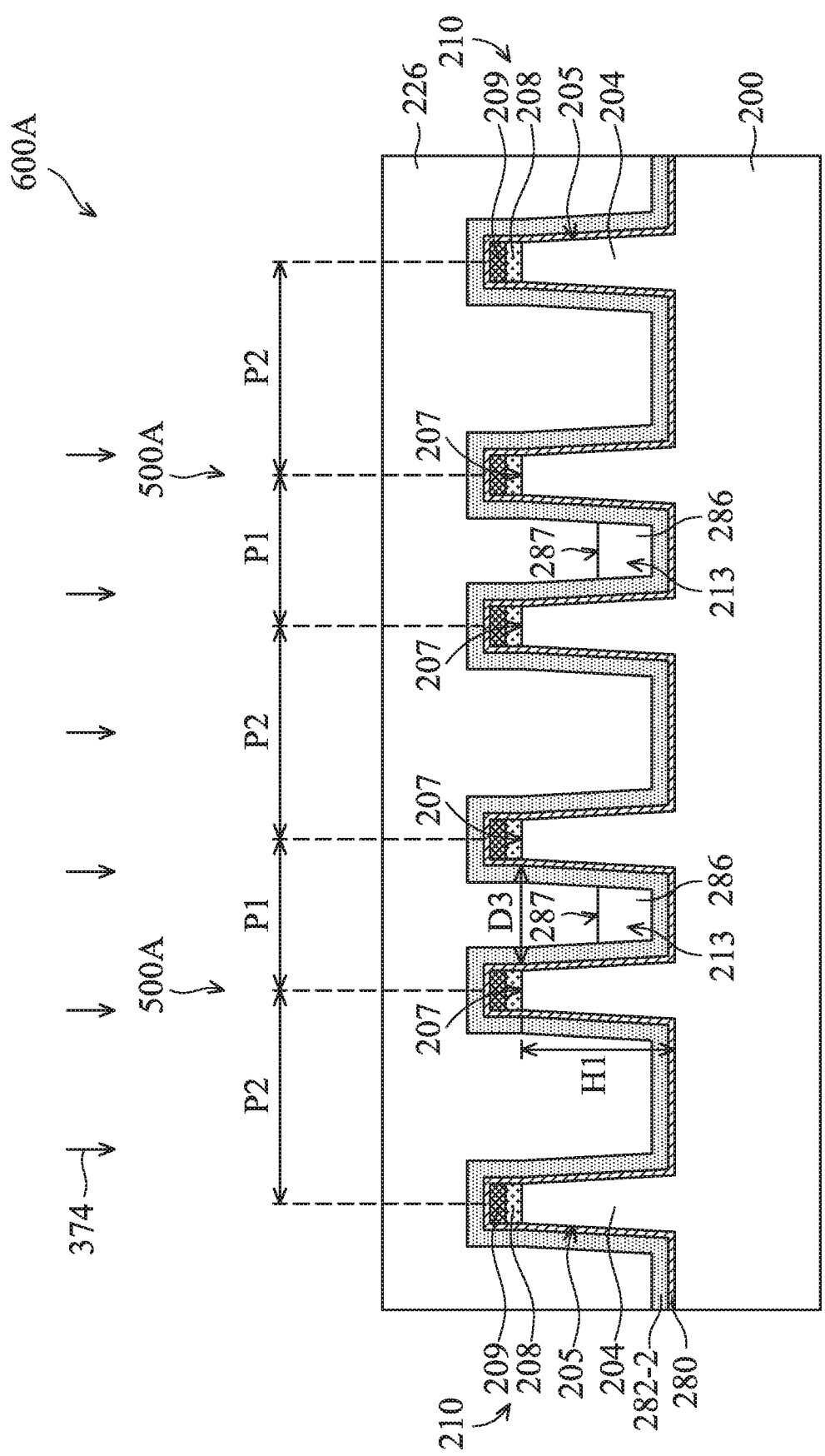

Afterwards, another insulation material conversion process 374 is performed is performed to cure (densify) the insulation material 226, as shown in FIG. 6 in accordance with some embodiments. The insulation material conversion process 374 may form Si—O bond in the insulation material 226. In addition, the insulation material conversion process 374 may help to further cure (densify) the first converted insulation material layer 282-2 and the second converted insulation material layer 286-1. The insulation material conversion process 374 may be performed under the same conditions as the insulation material conversion process 372, and the details thereof are not repeated herein.

Figure 7:
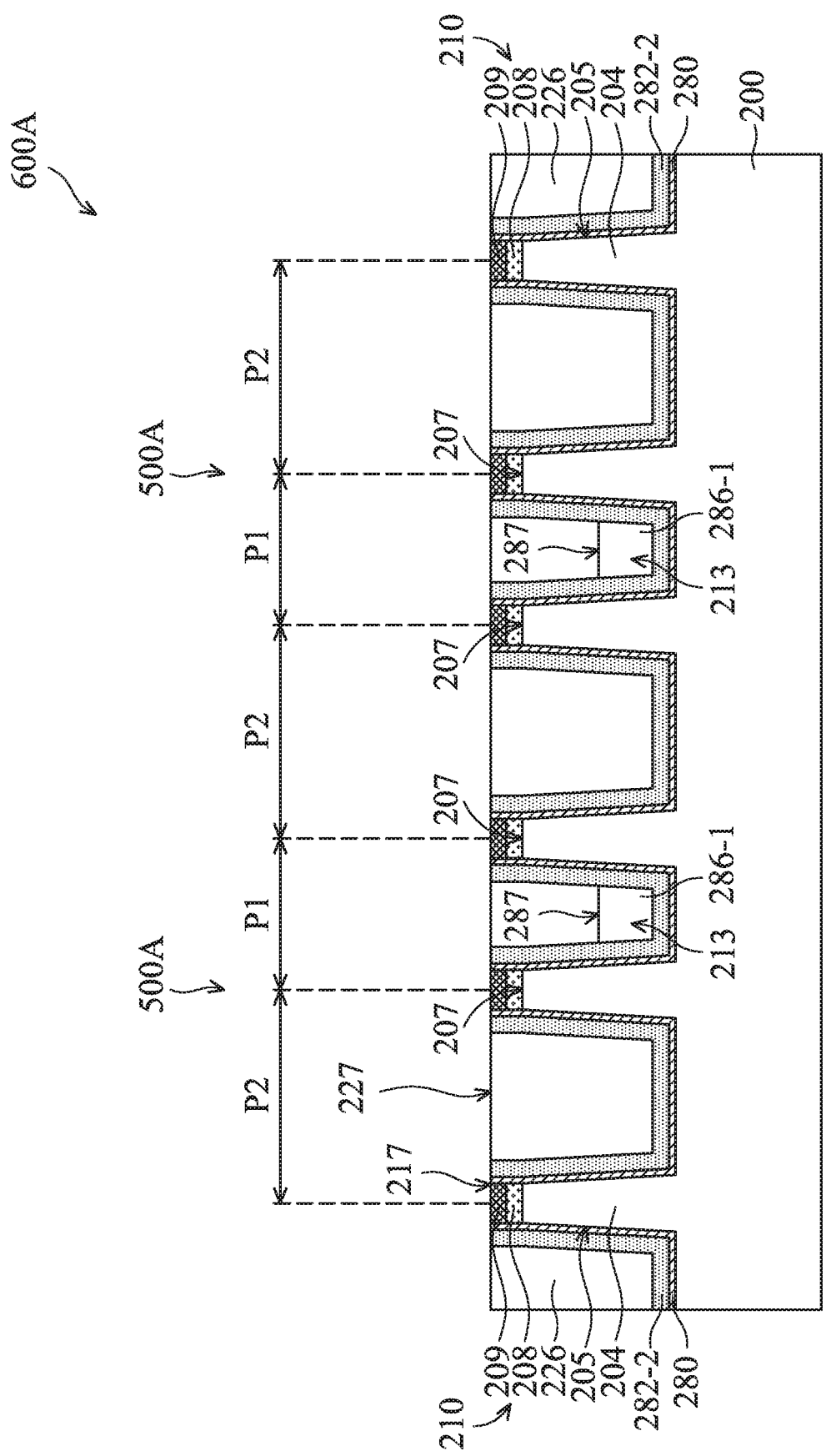

In the commonly used shallow trench isolation (STI) fabrication processes, the densify process of the STI material (e.g., insulation material conversion process 374 of the insulation material 226) may apply a tensile stress to the adjacent fin structures (e.g., the fin structures 204). The adjacent fin structures may be bent inwardly as a result. The inwardly bent fin structures arranged beside the narrow trenches (e.g., the trenches 211-1) may result in a narrow distance between upper portions of the adjacent fin structures. Therefore, the subsequent gate structures are difficult to form filling the gaps between the inwardly bent fin structures. To solve the aforementioned problem, the processes shown in FIGS. 1-4 (including the FCVD process of the insulation material, the UV pre-treatment process and the insulation material conversion process) may be adopted to compensate for the inward fin bending effect (e.g., by forming the first converted insulation material layer 282-2 and the second converted insulation material layer 286-1). The first converted insulation material layer 282-2 and the second converted insulation material layer 286-1 may collectively apply the outward bending force to the adjacent fin structures 204 before forming the insulation material 226. The outwardly bent fin structures (e.g., the fin structures 204 beside the trenches 211-1) may be bent inwardly by the densified insulation material 226 after performing the insulation material conversion process 374 of the STI material (e.g., the insulation material 226). Therefore, the fin structures 204 may stand upright, as shown in FIG. 7 in accordance with some embodiments. That is, the sidewall of the fin structure 204 extend along different direction before and after the insulation material conversion process 374 is performed. In some embodiments, the sidewall of the fin structure 204 extends alone the second direction before the insulation material conversion process 374 is performed and the sidewall of the fin structure 204 extends alone a third direction different from the second direction after the insulation material conversion process 374 is performed.

In some embodiments, the distance D2 (FIG. 5) between upper portions of the adjacent fin structures 204 before performing the insulation material conversion process 374 is different from a distance D3 (FIG. 6) between the upper portions of the adjacent fin structures 204 after performing the insulation material conversion process 374. For example, the distance D2 may be greater than the distance D3. In addition, the distance D1 (FIG. 3) between upper portions of the adjacent fin structures 204 before performing the insulation material conversion process 374 may be equal to the distance D3 (FIG. 6) between the upper portions of the adjacent fin structures 204 after performing the insulation material conversion process 374.

Afterwards, the insulation material 226, the first converted insulation material layer 282-2 and the liner layer 280 over the top surfaces of the fin structures 204 are removed by a planarization process, as shown in FIG. 7 in accordance with some embodiments. The planarization process, such as CMP, may be performed until top surfaces 217 of the patterned mask 210 are exposed. After performing the planarization process, a top surface 227 of the insulation material 226 may be aligned the top surfaces 217 of the patterned masks 210.

Figure 8:
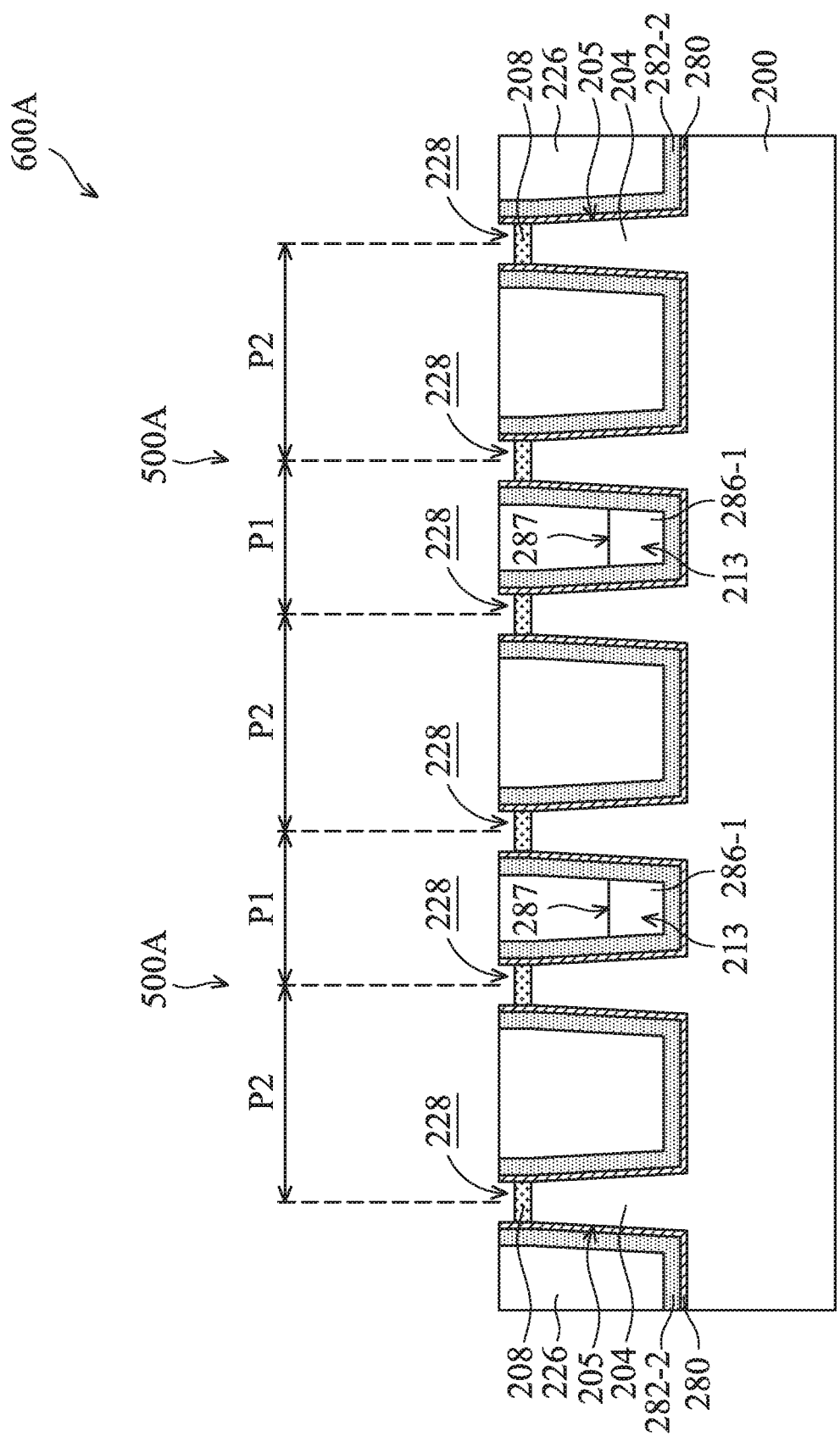

Afterward, the patterned pad nitrides 209 of the patterned masks 210 (FIG. 7) are removed by a removal process, as shown in FIG. 8 in accordance with some embodiments. In some embodiments, the etching process includes a wet etching process using phosphoric acid (e.g., $H_3PO_4$). Therefore, openings 228 are formed in the insulation material 226 exposing the top surfaces of the patterned pad oxides 208. In addition, the removal process may remove portions of the liner layer 280 and the first converted insulation material layer 282-2 that over the top surfaces of the fin structures 204.

Figure 9:
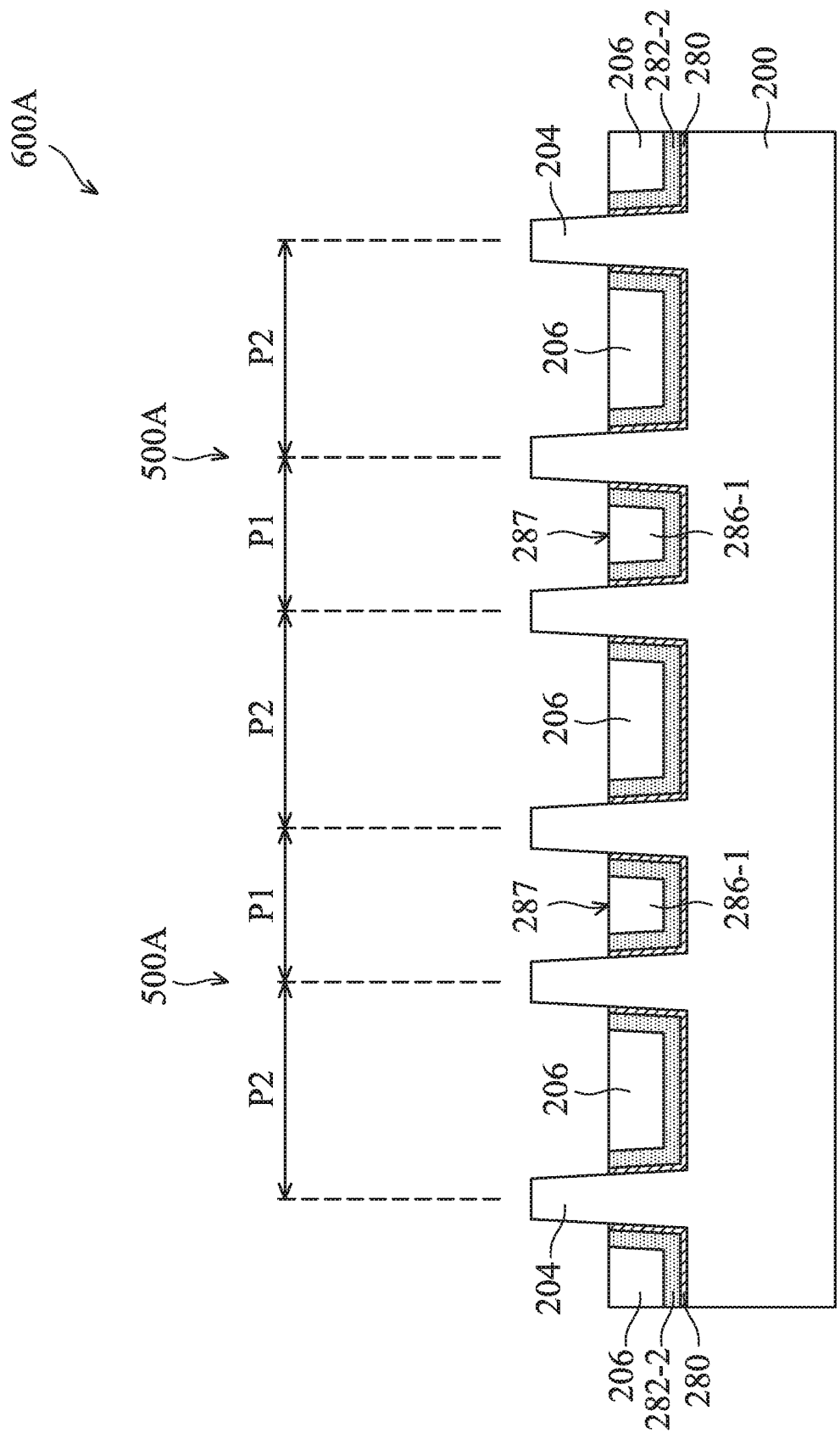

Afterward, the insulation material 226 (FIG. 8) is recessed to form isolation structures 206, such as shallow trench isolation (STI) structures, by an etching process, as shown in FIG. 9 in accordance with some embodiments. The isolation structures 206 may be formed covering lower portions of the fin structures 204 and leaving upper portions of the fin structures 204 above the isolation structures 206. In addition, the etching process may remove portions of the liner layer 280 and the first converted insulation material layer 282-2 over the upper portions of the fin structures 204. Furthermore, top surfaces of the isolation structures 206 may be leveled with the top surfaces 287 of the second converted insulation material layers 286-1. In some embodiments, the etching process includes a dry etching process using an etching gas comprising ammonia (e.g. $NH_3$) and hydrogen fluoride (HF).

Figure 10:
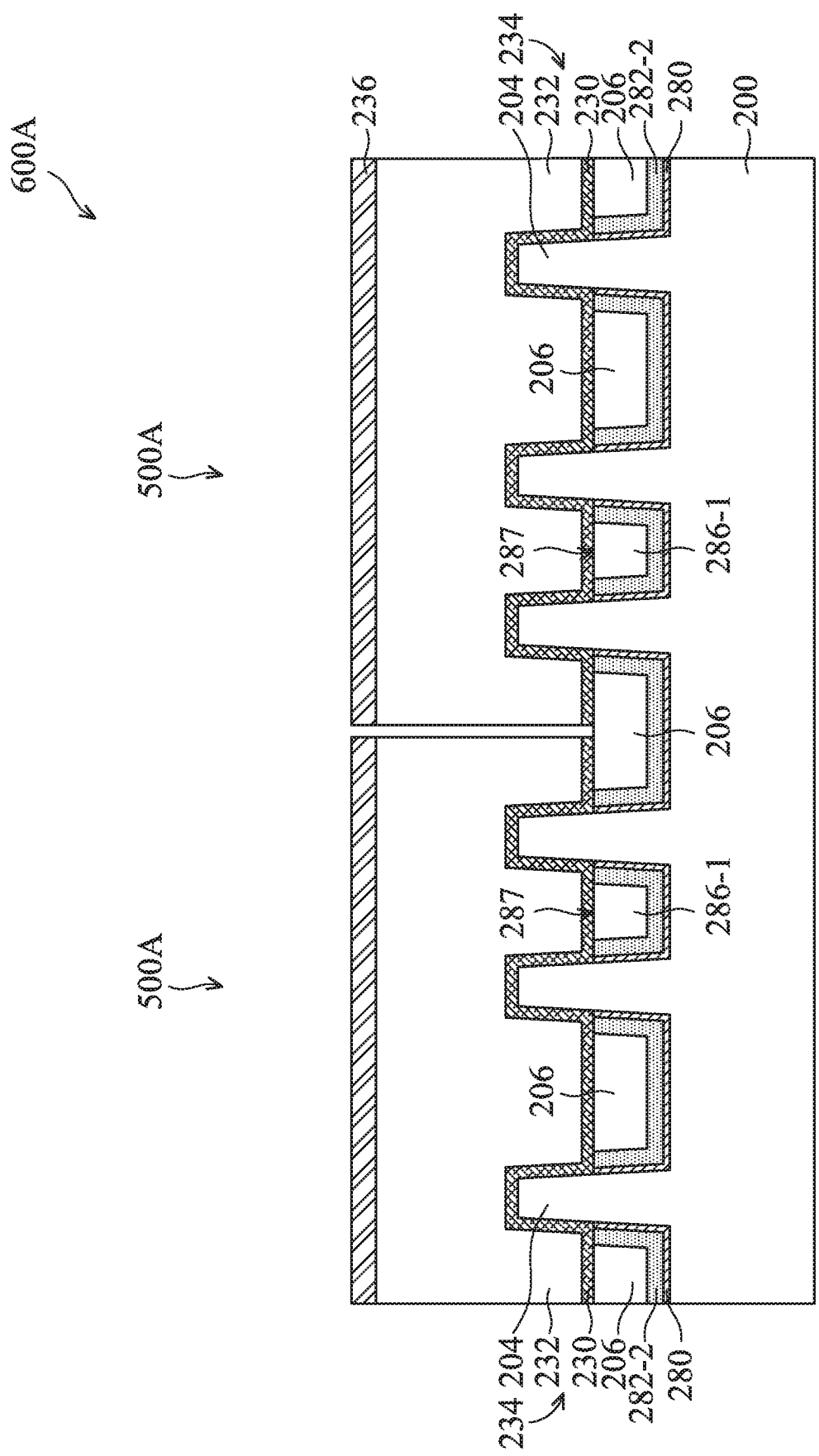
Figure 11A:
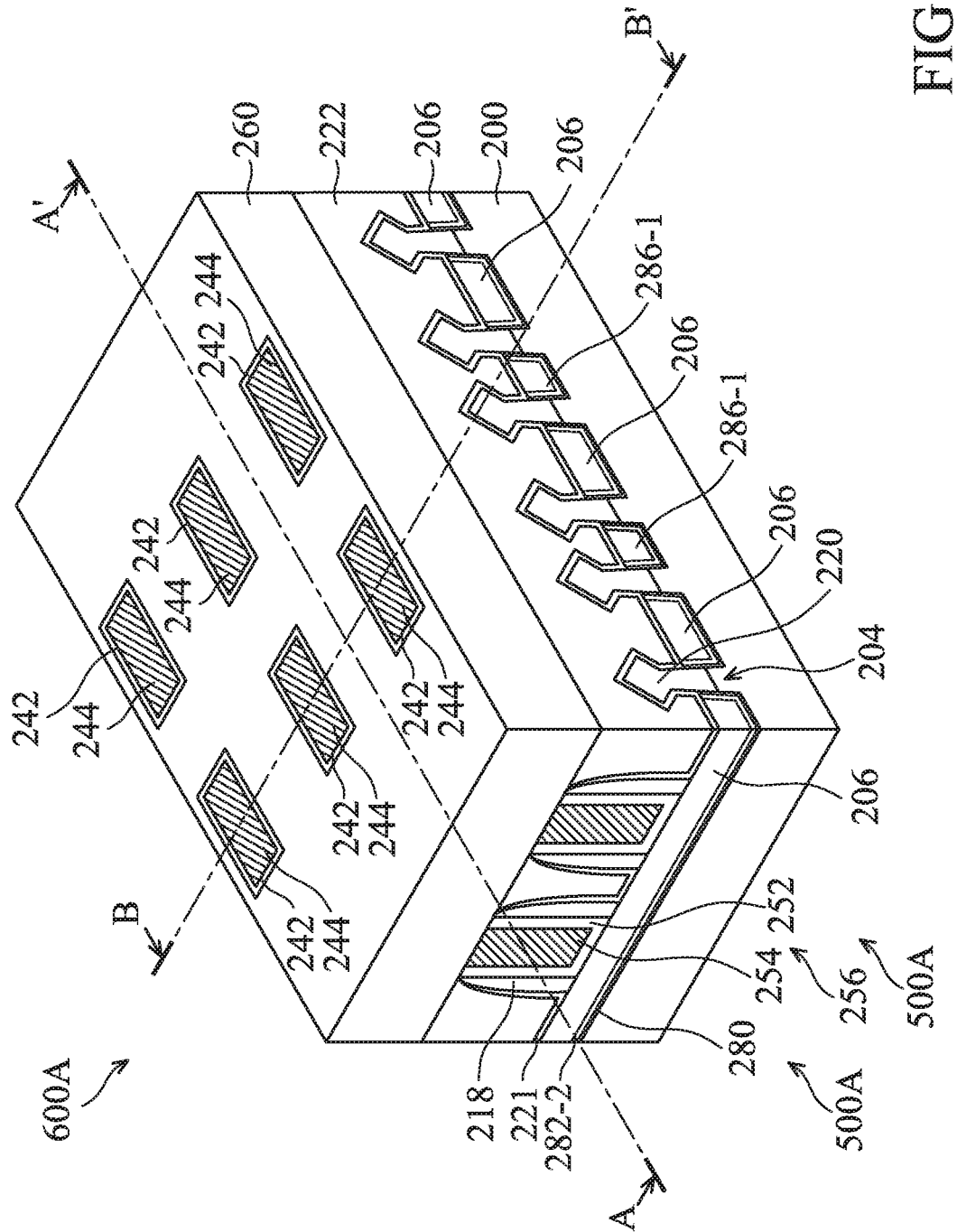
FIG. 11A is a perspective view of a semiconductor structure showing various stages of a method of forming a semiconductor structure after performing the stage shown in FIG. 10, in accordance with some embodiments.
Figure 11B:
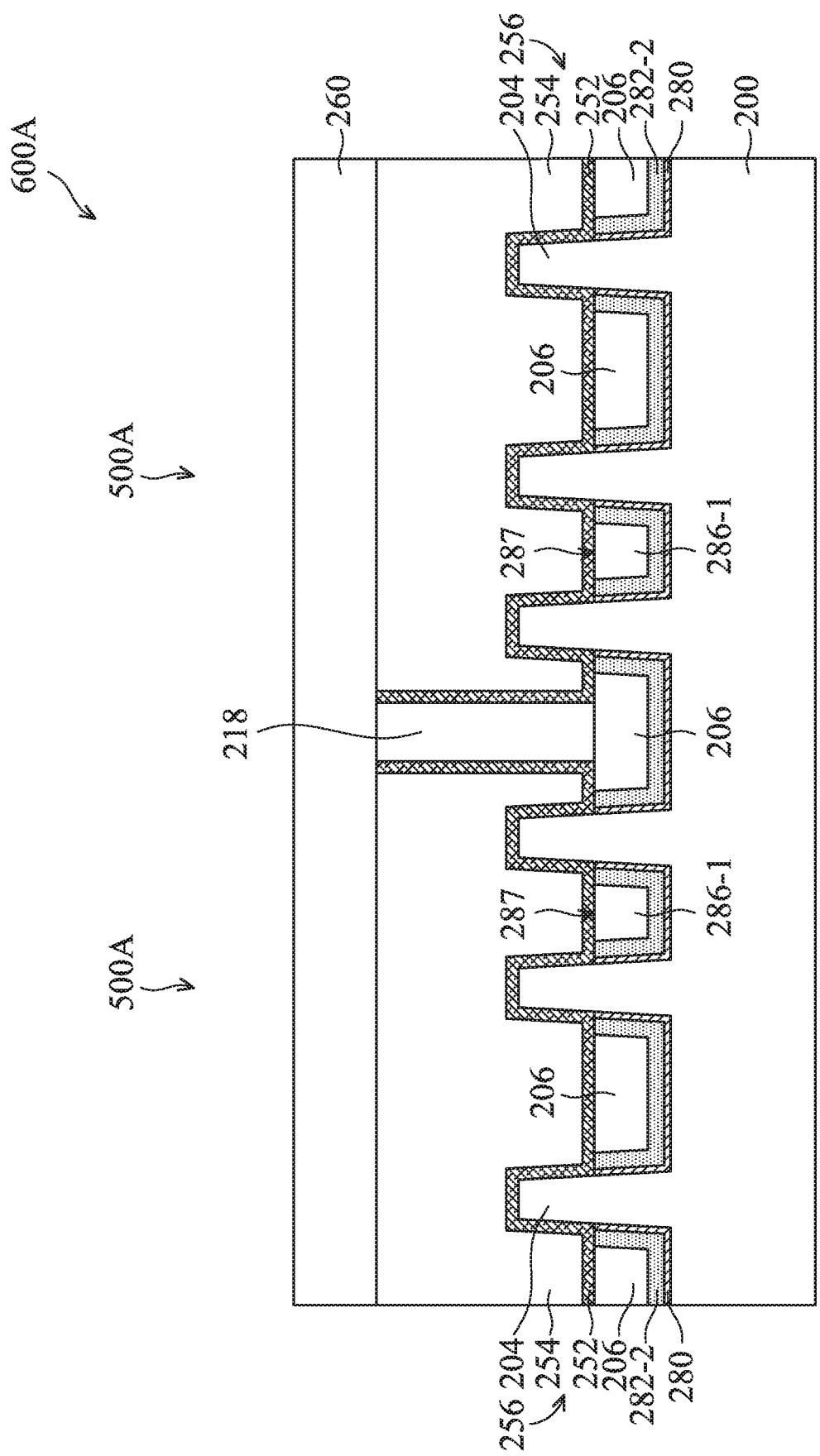
FIG. 11B is a cross-sectional view along line A-A' of FIG. 11A showing various stages of a method of forming a semiconductor structure after performing the stage shown in FIG. 10, in accordance with some embodiments.
Figure 11C:
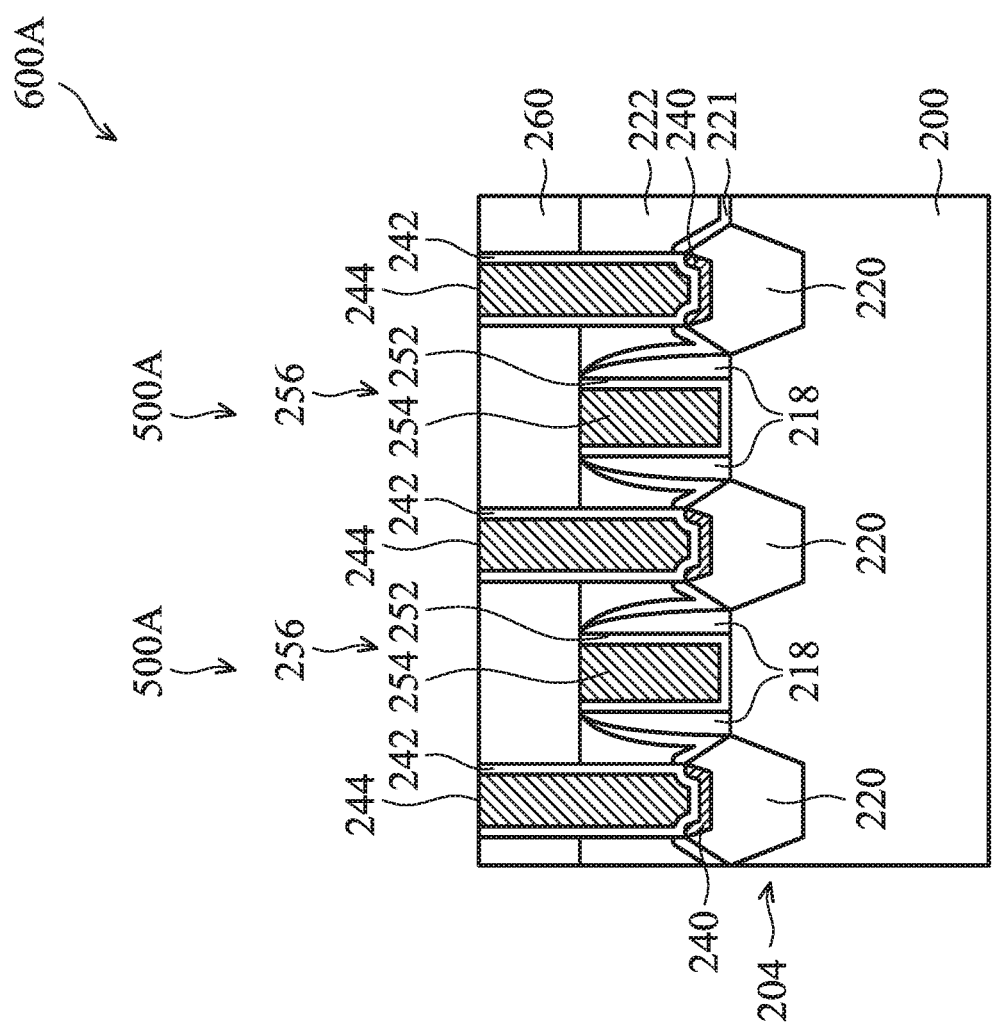
FIG. 11C is a cross-sectional view along line B-B' of FIG. 11A showing various stages of a method of forming a semiconductor structure after performing the stage shown in FIG. 10, in accordance with some embodiments.

Afterward, dummy gate structures 234 are formed over channel regions of the fin structures 204, respectively, as shown in FIG. 10 in accordance with some embodiments. Each of the dummy gate structures 234 may include a gate dielectric 230 and a gate 232 overlying the gate dielectric 230. The dummy gate structures 234 may be formed by deposition processes and the subsequent patterning process using mask patterns 236 over dummy gate structures 234.

The gate dielectrics 230 may be silicon dioxide. For example, the silicon dioxide is a thermally grown oxide. In some embodiments, the gate dielectrics 230 are formed of a high dielectric constant (high-k) dielectric material. A high-k dielectric material has a dielectric constant (k) higher than that of silicon dioxide. Examples of high-k dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-k material, or a combination thereof. In some embodiments, the gates 232 include polycrystalline-silicon (poly-Si), poly-crystalline silicon-germanium (poly-SiGe), metallic nitride, metallic silicide, metallic oxide, metal, and other suitable layers. In some embodiments, the gates 232 are made of, for example, polysilicon. The mask patterns 236 may be formed of, for example, silicon nitride or the like.

FIG. 11A is a perspective view to illustrate various stages of a process for forming the FinFETs 500A of the semiconductor structure 600A after performing the stage shown in FIG. 10. FIGS. 11B and 11C are cross-sectional views of various stages of a process for forming the FinFETs 500A of the semiconductor structure 600A after performing the stage shown in FIG. 10. In some embodiments, the processes shown in FIGS. 11A, 11B and 11C are performed for both the PMOS region and the NMOS region, with some materials (e.g. dopants for source/drain regions, or work function layers of metal gates) adjusted to suit the type of devices (e.g. P-type FinFETs or N-type FinFETs) formed in the respective regions.

Afterward, gate spacers 218 are formed on opposite sidewalls of the dummy gate structure 234 and extend over the fin structure 204, as shown in FIGS. 11A, 11B and 11C in accordance with some embodiments. The gate spacers 218 may include a single layer structure or a multi-layer structure. The gate spacer spacers 218 may be made of low dielectric constant (low-k) materials (e.g., k<5), such as silicon oxide, silicon nitride, silicon oxynitride, silicon carbide, silicon carbonitride, another suitable material, or a combination thereof. In some embodiments, the gate spacers 218 are formed by a deposition process and a subsequent etching process. The deposition process may include a chemical vapor deposition (CVD) process, a physical vapor deposition (PVD) process, a spin-on process, another applicable process, or a combination thereof. The etching process may include a dry etch process.

Afterward, source/drain structures 220 are formed in the fin structures 204, as shown in FIGS. 11A, 11B and 11C in accordance with some embodiments. The source/drain structures 220 are formed by etching the fin structures 204 to form recesses (not shown), and epitaxially growing a material in the recesses, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof. In some embodiments, the source/drain structures 220 formed in the PMOS region (e.g. for the P-type FinFET) includes silicon germanium (SiGe), and a p-type impurity such as boron or indium. In some embodiments, the source/drain structures 220B formed in the NMOS region (e.g. for the N-type FinFET) includes silicon carbide (SiC), silicon phosphorous (SiP), phosphorous-doped silicon carbon (SiCP), or the like.

Afterward, a contact etch stop layer (CESL) 221 is conformally deposited over the source/drain structures 220 and the gate spacers 218 by a thin film deposition process, as shown in FIGS. 11A and 11C in accordance with some embodiments. The CESL 221 may serve as an etch stop layer of the subsequent etching process configured to form source/drain contact holes (not shown). In some embodiments, the CESL 221 may be a single layer or multiple layers. The CESL 221 may be made of silicon carbide (SiC), silicon nitride ($Si_xN_y$), silicon carbonitride (SiCN), silicon oxycarbide (SiOC), silicon oxycarbon nitride (SiOCN), tetraethoxysilane (TEOS) or another applicable material. In some embodiments, the CESL 221 has a bi-layer structure which includes a TEOS layer formed on a SiC layer. A TEOS layer has better moisture prevention than a SiC layer. In addition, a SiC layer is used as a glue layer to improve adhesion between the underlying layer and the TEOS layer. In some embodiments, the CESL 221 is formed by performing a plasma enhanced chemical vapor deposition (CVD) process, a low pressure CVD process, an atomic layer deposition (ALD) process, or another applicable process.

Afterward, an interlayer dielectric (ILD) layer (e.g., a first ILD layer) 222 is formed over the fin structure 204, as shown in FIGS. 11A, 11B and 11C in accordance with some embodiments. The ILD layer 222 may be formed over the CESL 221, the first converted insulation material layer 282-2 and the second converted insulation material layer 286-1. In addition, the ILD layer 222 may fill gaps between the dummy gate structures 234. The ILD layer 222 may be formed of a dielectric material such as phosphosilicate glass (PSG), borosilicate glass (BSG), boron-doped phosphosilicate glass (BPSG), undoped silicate glass (USG), or the like, and may be deposited by any suitable method, such as CVD, PECVD, or FCVD.

Afterward, the metal gate structures 256 respectively replace the dummy gate structures 234 by the gate-replacement process, as shown in FIGS. 11A, 11B and 11C in accordance with some embodiments. In the gate-replacement process, the dummy gate structures 234 (FIG. 10) and the mask patterns 236 may be replaced with the gate structures 256 by a removal process, a deposition processes and a subsequent planarization process. In some embodiments, the gate structures 256 are surrounded by the gate spacers 218 includes a gate dielectric layer 252 and a gate electrode layer 254 over the gate dielectric layer 252. The source/drain structures 220 may be positioned adjacent to the gate structures 256. In some embodiments, the gate spacers 218 are positioned on opposite sidewall surfaces of the gate structure 256.

In some embodiments, the gate dielectric layers 252 include a single layer or multiple layers. In some embodiments, the gate dielectric layers 252 have a U-shape or a rectangular shape. In some embodiments, the gate dielectric layers 252 are formed of silicon oxide, silicon nitride, or a high-k dielectric material (k>7.0) including a metal oxide or a silicate of Hf, Al, Zr, La, Mg, Ba, Ti, Pb, or a combination thereof. The formation methods of gate dielectric layers 252 may include molecular beam deposition (MBD), atomic layer deposition (ALD), plasma enhanced CVD (PECVD), and the like.

In some embodiments, the gate electrode layers 254 are made of a metal-containing material such as TiN, TaN, TaC, Co, Ru, Al, combinations thereof, or multi-layers thereof, and are formed by a deposition process, such as electroplating, electroless plating, or another suitable method.

In some embodiments, a work function layer (not shown) may be formed in each of the gate structures 256. The work function layer may include an N-type work-function layer or a P-type work-function layer. The P-type work function layer may include TiN, TaN, Ru, Mo, Al, WN, $ZrSi_2$, $MoSi_2$, $TaSi_2$, $NiSi_2$, WN, another suitable P-type work function material, or a combination thereof. The N-type work function layer may include Ti, Ag, TaAl, TaAlC, TiAlN, TaC, TaCN, TaSiN, Mn, Zr, another suitable N-type work function material, or a combination thereof. For example, the work function layer in the gate structures 256 may include the P-type work-function layer, and the gate structure 256B may include the N-type work-function layer.

Afterward, another ILD layer (e.g., a second ILD layer) 260 is formed over the dielectric layer 222 and the gate structures 256, as shown in FIGS. 11A, 11B and 11C in accordance with some embodiments. For example, the ILD layer 260 may be a flowable film formed by a flowable CVD method. In some embodiments, the ILD layer 260 is formed of a dielectric material such as PSG, BSG, BPSG, USG, or the like, and may be deposited by any suitable method, such as CVD and PECVD.

Afterward, source/drain silicide layers 240 are formed on the source/drain structures 220 by a patterning process and a subsequent silicidation process, as shown in FIG. 11C in accordance with some embodiments. The patterning process may be performed to form openings (not shown) passing through the ILD layers 222 and 260 and the CESL 221 to expose the source/drain structures 220. For example, the patterning process include a photolithography processes and a subsequent etching process. The photolithography process may include photoresist coating (e.g. spin-on coating), soft baking, mask aligning, exposure, post-exposure baking, developing the photoresist, rinsing and drying (e.g., hard baking). In some embodiments, the etching process is a dry etching process. The silicidation process may include a metal material deposition process and an annealing process performed in sequence. In some embodiments, the deposition process of the silicidation process includes a physical vapor deposition (PVD) process, an atomic layer deposition (ALD) process, or another applicable process. In some embodiments, the annealing process of the silicidation process is performed at a temperature in a range from about 300° C. to about 800° C. After the annealing process, the unreacted metal material is removed.

In some embodiments, the source/drain silicide layers 240 are formed of one or more of cobalt silicide (e.g. CoSi, $CoSi_2$, $Co_2Si$, $Co_2Si$, $Co_3Si$; collectively "Co silicide"), titanium silicide (e.g. $Ti_5Si_3$, TiSi, $TiSi_2$, $TiSi_3$, $Ti_6Si_4$; collectively "Ti silicide"), nickel silicide (e.g. $Ni_3Si$, $Ni_{31}Si_{12}$, $Ni_2Si$, $Ni_3Si_2$, NiSi, $NiSi_2$; collectively "Ni silicide"), copper silicide (e.g. $Cu_{17}Si_3$, $Cu_{56}Si_{11}$, $Cu_5Si$, $Cu_{33}Si_7$, $Cu_4Si$, $Cu_{19}Si_6$, $Cu_3Si$, $Cu_{87}Si_{13}$; collectively "Cu silicide"), tungsten silicide ($W_5Si_3$, $WSi_2$; collectively "W silicide"), and molybdenum silicide ($Mo_3Si$, $Mo_5Si_3$, $MoSi_2$; collectively "Mo silicide").

Afterward, glue layers 242 and contact plugs 244 are formed passing through the ILD layers 222 and 260 and connecting the source/drain structures 220, as shown in FIGS. 11A and 11C in accordance with some embodiments. The contact plugs 244 are surrounded by the glue layers 242, respectively. The contact plugs 244 are surrounded by the ILD layers 222 and 260. In addition, the contact plugs 244 are formed over the source/drain structure 220. Furthermore, the contact plugs 244 may be electrically connected to the source/drain structures 220.

In some embodiments, the glue layers 242 and the contact plugs 244 are formed by deposition processes and a subsequent planarization process such as CMP. The glue layers 242 may include an electrically conductive material such as titanium (Ti), titanium nitride (TiN), tantalum (Ta), tantalum nitride (TaN), or the like, and may be formed by a CVD process, such as plasma-enhanced CVD (PECVD). However, other alternative processes, such as sputtering or metal organic chemical vapor deposition (MOCVD), physical vapor deposition (PVD), atomic layer deposition (ALD), may also be used. In some embodiments, the contact plugs 244 may be formed of cobalt (Co). In some other embodiments, the contact plugs 244 may be made of a conductive material, such as copper (Cu), aluminum (Al), tungsten (W), titanium (Ti), titanium nitride (TiN), tantalum (Ta), tantalum nitride (TaN), or another applicable material. The contact plugs 244 may be formed by any suitable deposition method, such as PVD, CVD, ALD, plating (e.g., electroplating).

After performing the aforementioned processes, the FinFETs 500A are formed over the fin structure 204. Moreover, a semiconductor structure 600A including the FinFET 500A (e.g., the P-type FinFET or the N-type FinFET) is formed, as shown in FIGS. 11A, 11B and 11C in accordance with some embodiments.

In some embodiments, the semiconductor structure 600A uses the first converted insulation material layer 282-2 and the second converted insulation material layer 286-1 to apply the tensile stress to the adjacent fin structures 204 beside the trenches 211-1 before forming the STI structures (e.g., the isolation structures 206). Therefore, the fin structures 204 may be bent outwardly. The outwardly bent fin structures may be bent inwardly by the densified insulation material 226 after performing the STI insulation material conversion process (e.g., the insulation material conversion process 374). Therefore, the fin structures 204 may stand upright after forming the STI structures (e.g., the isolation structures 206), as shown in FIG. 7 in accordance with some embodiments. In addition, the straight fin structures 204 may facilitate the filling of the subsequent dummy gate material or metal gate material and enlarges the window for the gate filling process. The device performance may be improved.

FIG. 12, FIG. 13, FIG. 14, FIG. 15 and FIG. 16 are cross-sectional views taken transversely with respect to the channel direction of the fin structure 204. FIG. 12, FIG. 13, FIG. 14, FIG. 15 and FIG. 16 show various stages of a method of forming a semiconductor structure 600B, in accordance with some embodiments. FIG. 17A is a perspective view showing various stages of a process of forming a semiconductor structure 600B after performing the stage shown in FIG. 16. FIG. 17B is a cross-sectional view along line A-A' of FIG. 17A showing various stages of a process of forming a semiconductor structure 600B after performing the stage shown in FIG. 16. FIG. 17C is a cross-sectional view along line B-B' of FIG. 17A showing various stages of a process of forming a semiconductor structure 600B after performing the stage shown in FIG. 16.

Figure 13:
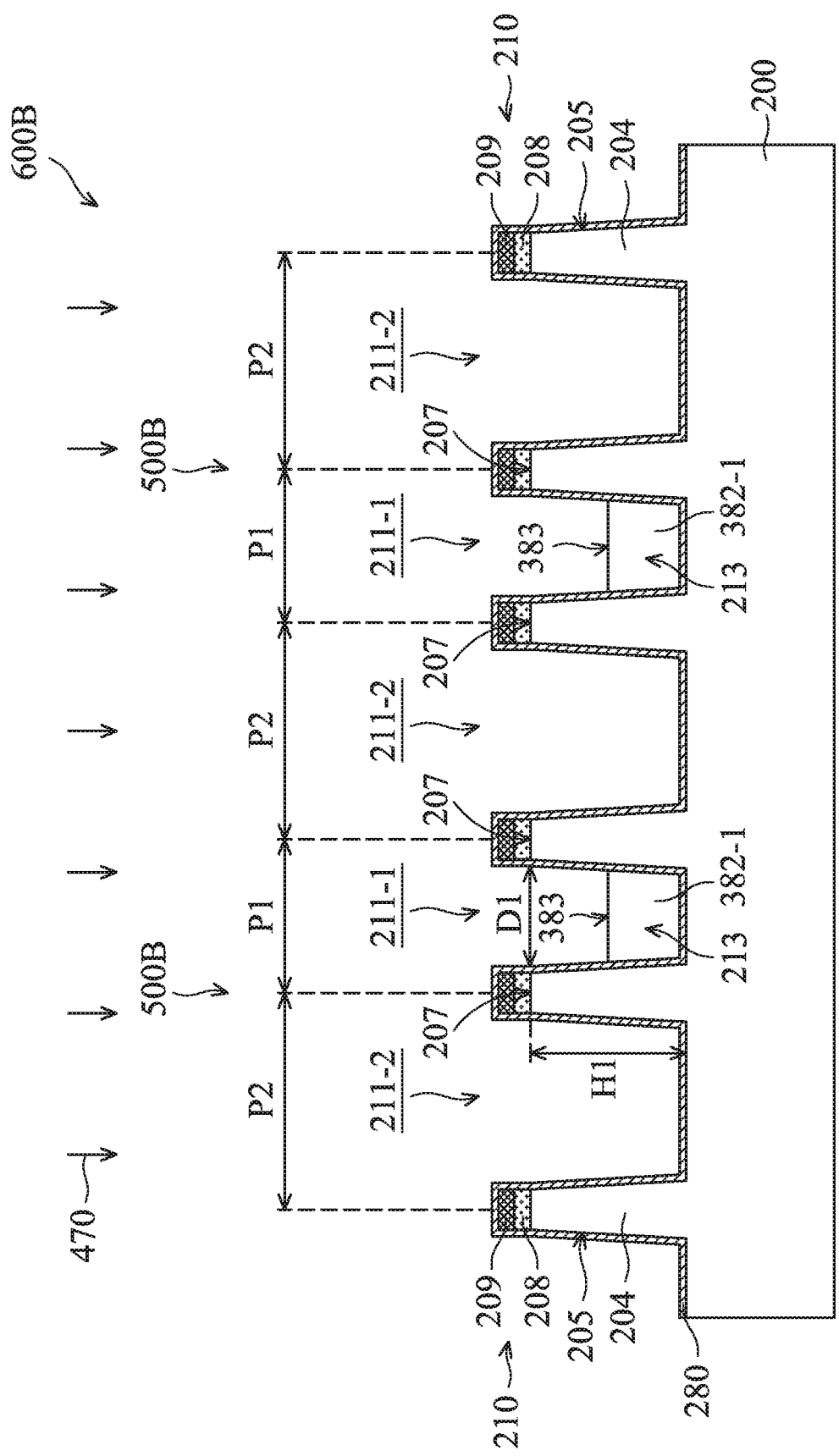

After the liner layer 280 is formed, first insulation material layers 382 are formed in portions of the trenches 211-1 between the fin structures 204, as shown in FIG. 13 in accordance with some embodiments. Because the aspect ratio of the trenches 211-1 may be higher than the aspect ratio of the trenches 211-2, the first insulation material layers 382 may be deposited to fill the trenches 211-1 prior than the trenches 211-2 by the flowable CVD process. Therefore, the first insulation material layer 382 may fill a portion of each of the trenches 211-1 rather than portions of the trenches 211-2 by controlling the process time of the flowable CVD process. In some embodiments, the first insulation material layer 382 is formed filling bottom portions 213 of the trenches 211-1. In some embodiments, a top surface 383 of each of the first insulation material layers 382 may be positioned lower than the top surfaces 207 of the fin structures 204. For example, the top surface 383 of each of the first insulation material layers 382 may be positioned between about one-third to about a quarter of the height H1 of the fin structures 204.

In some embodiments, the materials and/or processes of the first insulation material layer 382 may be similar to, or the same as, those of the first insulation material layer 282 (FIG. 1). For example, the first insulation material layer 382 may be formed of, for example, silicon dioxide formed by a flowable CVD process.

Afterwards, a pre-treatment process 470, for example, an ozone (O3) pre-treatment process, is performed on the first insulation material layer 382 (FIG. 12) to form a first treated insulation material layer 382-1, as shown in FIG. 13 in accordance with some embodiments. The pre-treatment process 470 may be performed to partially break the Si—N bond and Si—H bond in the first insulation material layer 382. In addition, the pre-treatment process 470 may convert Si—N bond and Si—H bond into Si—O bond. Therefore, Si—O bond is formed in the first treated insulation material layer 382-1 after performing the pre-treatment process 470. The volume of the first treated insulation material layer 382-1 may be equal to the volume of the first insulation material layer 382 after performing the pre-treatment process 470. In some embodiments, the pre-treatment process 470 may be performed using a process gas including Ar, $O_3$, $O_2$, He, $N_2$, etc. Process temperature range is around 25° C. to 500° C.

Figure 14:
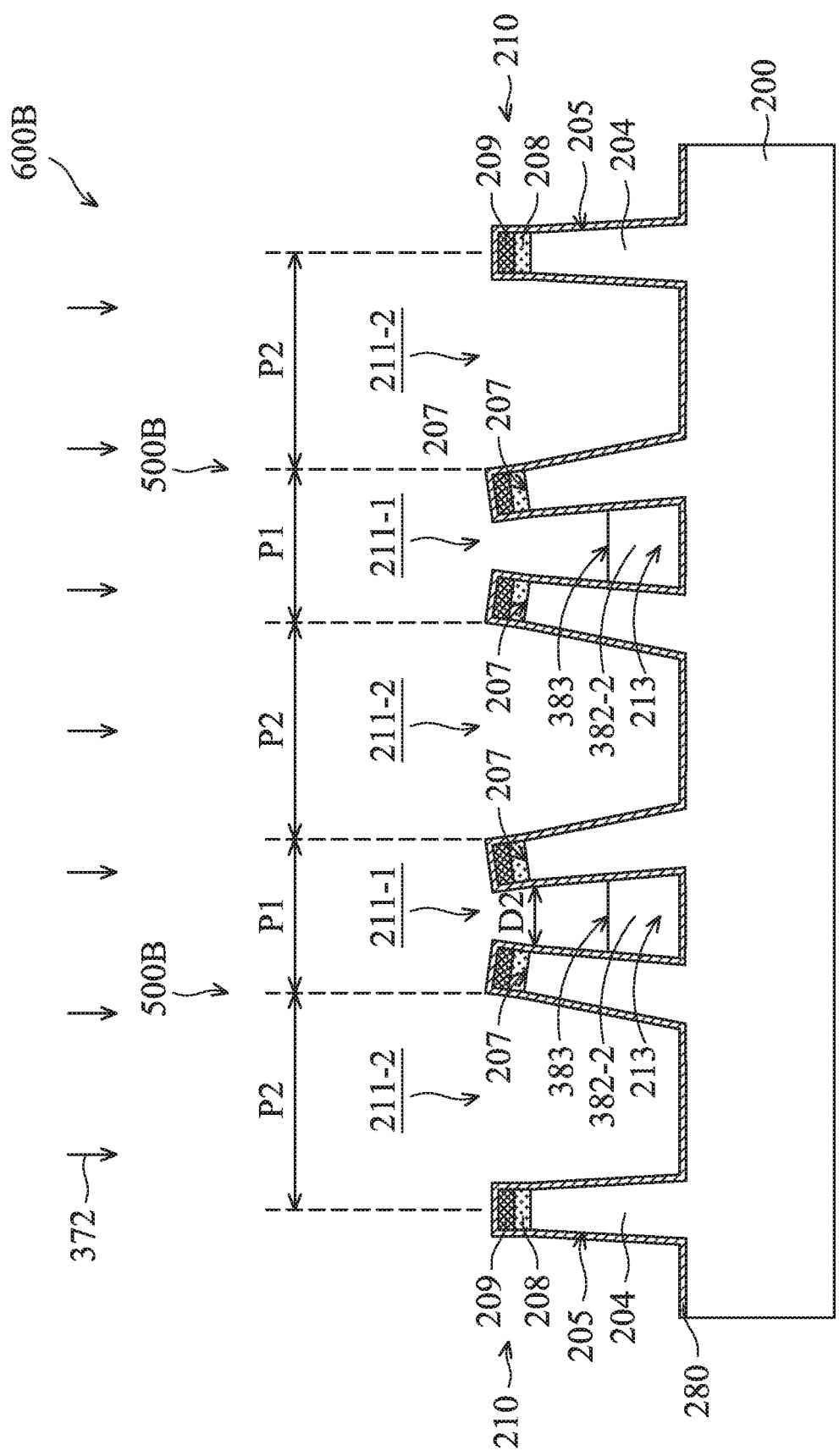

Afterwards, an insulation material conversion process 372 is performed on the first treated insulation material layer 382-1 (FIG. 13), as shown in FIG. 14 in accordance with some embodiments. The insulation material conversion process 372 may help to break the remaining Si—N bond and Si—H bond in the second insulation material layer 286. In addition, the insulation material conversion process 372 may convert Si—N bond and Si—H bond into Si—O bond. Therefore, the first treated insulation material layer 382-1 may be converted into a first converted insulation material layer 382-2 after performing the insulation material conversion process 372. In addition, Si—O bond is formed in the first converted insulation material layer 382-2. Compared with the first treated insulation material layer 382-1, the first converted insulation material layer 382-2 may have a densified structure and a shrunk volume.

Figure 15:
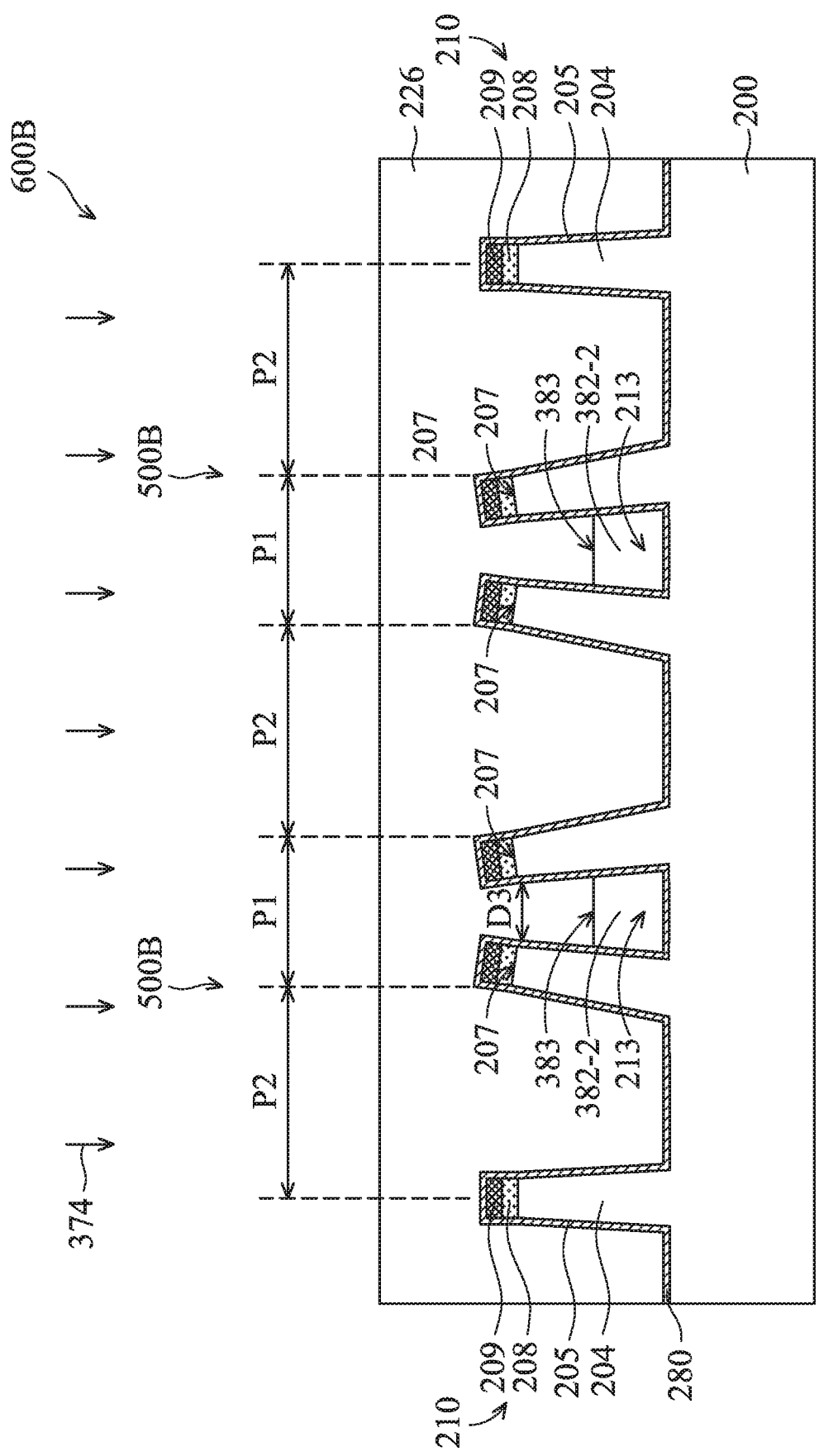

After performing the insulation material conversion process 372, the first converted insulation material layer 382-2 may apply a compress stress to the adjacent fin structures 204, as shown in FIG. 15 in accordance with some embodiments. Because the top surface 383 of each of the first insulation material layers 382 (FIG. 13) may be positioned between about one-third to about a quarter of the height $H_1$ of the fin structures 204. The trench 211-1 may have enough space to allow upper portions of the adjacent fin structures 204 bent inwardly by the compressive stress induced from the converted first converted insulation material layer 382-2. In some embodiments, the distance D1 (FIG. 13) between the upper portions of the adjacent fin structures 204 before performing the insulation material conversion process 372 may be different from the distance D2 (FIG. 14) between the upper portions of the adjacent fin structures 204 after performing the insulation material conversion process 372. For example, the distance D1 is less than the distance D2.

Afterwards, the insulation material 226 is formed covering the first converted insulation material layer 382-2 in the trenches 211-1, as shown in FIG. 15 in accordance with some embodiments. The insulation material 226 is entirely formed over the fin structures 204. In addition, the insulation material 226 is formed to fill the trenches 211-1 and 211-2 (FIG. 15) and cover the fin structures 204, the liner layer 280 and the first converted insulation material layer 382-2.

Afterwards, the insulation material conversion process 374 is performed to cure (densify) the insulation material 226, as shown in FIG. 15 in accordance with some embodiments. The insulation material conversion process 374 may form Si—O bond in the insulation material 226. In addition, the insulation material conversion process 374 may help to further cure (densify) the first converted insulation material layer 382-2. As previously described, the densify process (e.g., the insulation material conversion process 374) of the STI material (e.g., the insulation material 226) may apply a tensile stress to the adjacent fin structures (e.g., the fin structures 204) arranged beside the narrow trenches (e.g., the trenches 211-1). The adjacent fin structures 204 may be bent further inwardly. In some embodiments, the distance D2 (FIG. 14) between upper portions of the adjacent fin structures 204 before performing the insulation material conversion process 374 is different from a distance D3 (FIG. 15) between the upper portions of the adjacent fin structures 204 after performing the insulation material conversion process 374. For example, the distance D2 may be greater than the distance D3.

Figure 16:
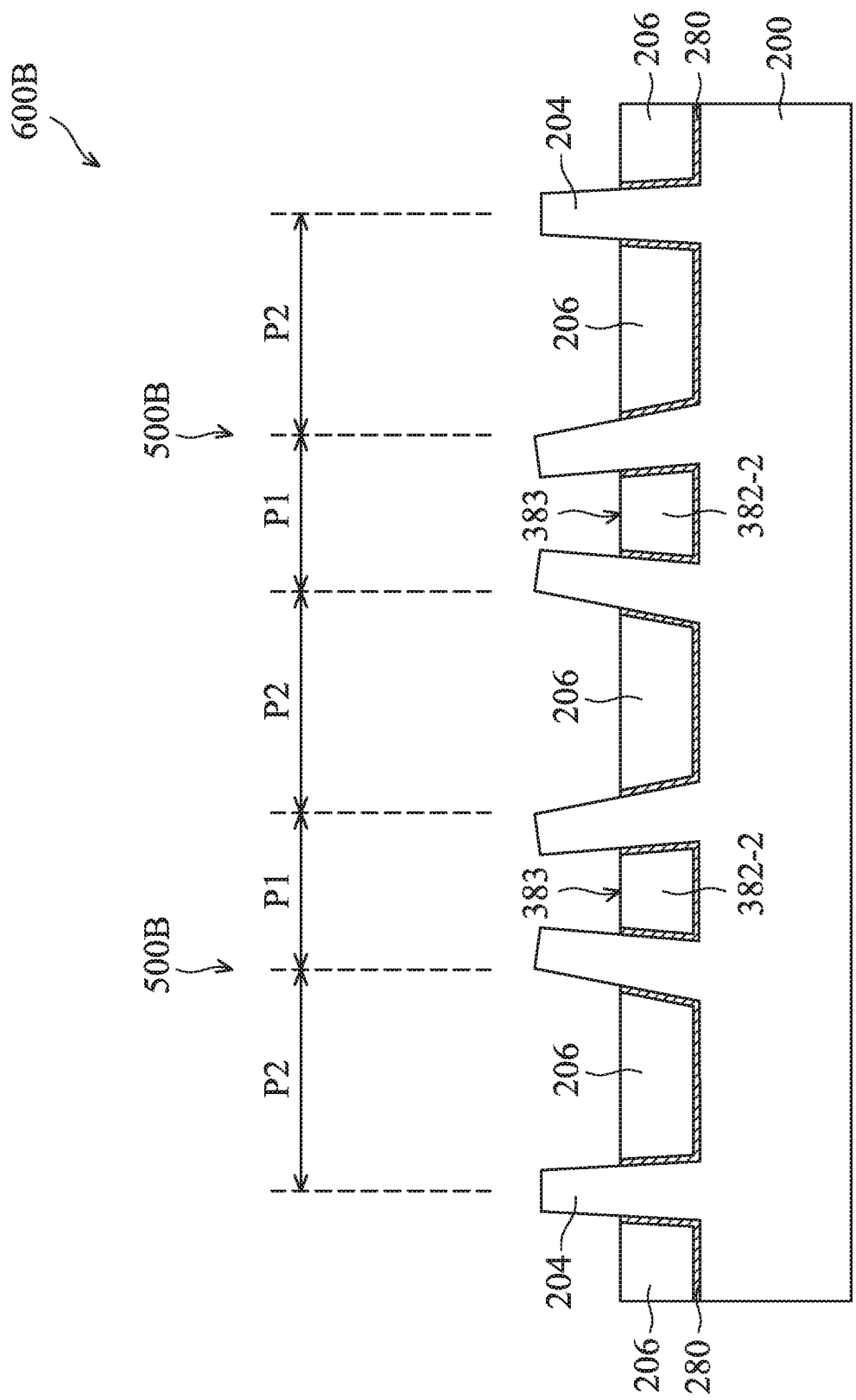
Figure 17A:
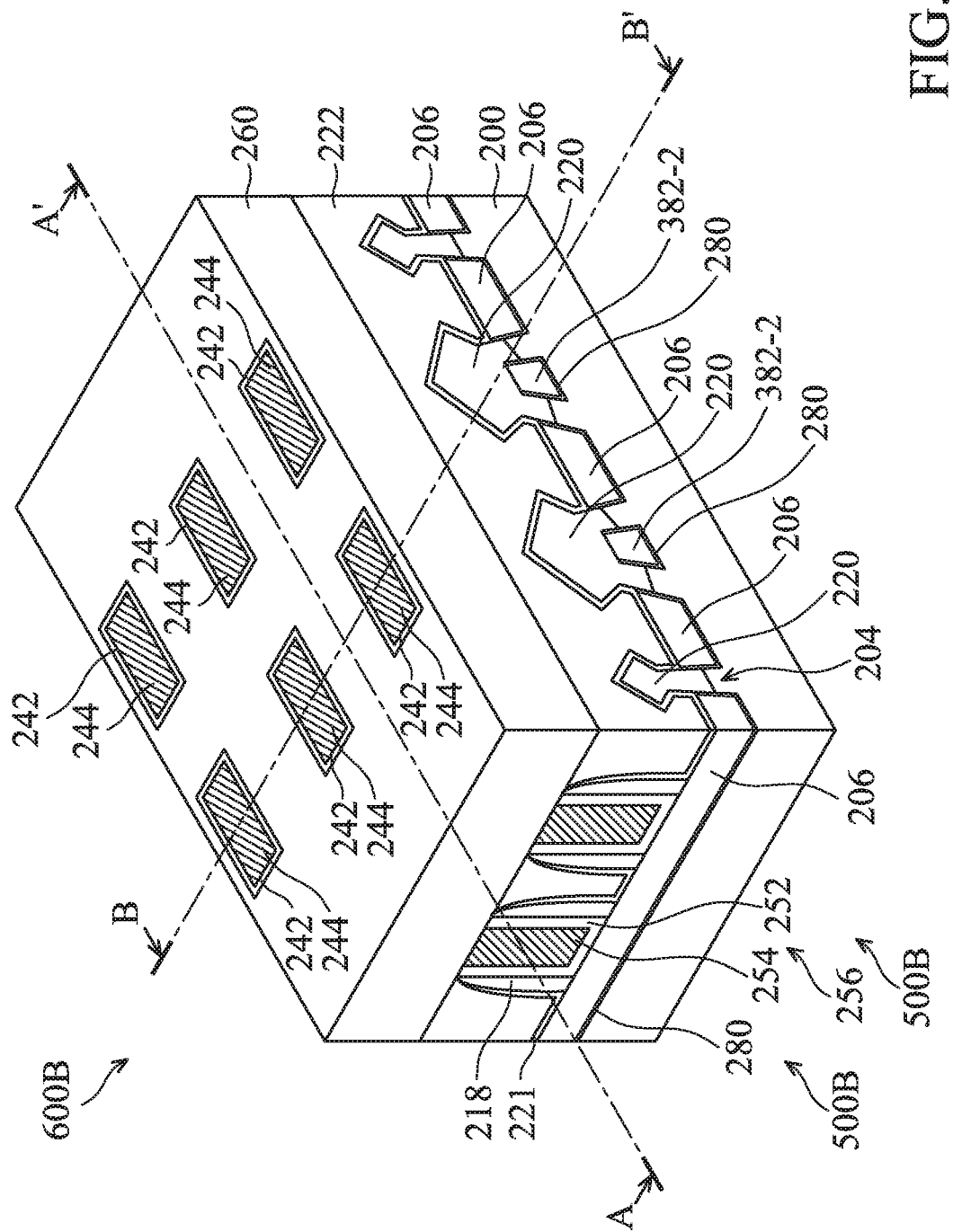
FIG. 17A is a perspective view of a fin field-effect transistor (FinFET) structure showing various stages of a method of forming a semiconductor structure after performing the stage shown in FIG. 16, in accordance with some embodiments.
Figure 17B:
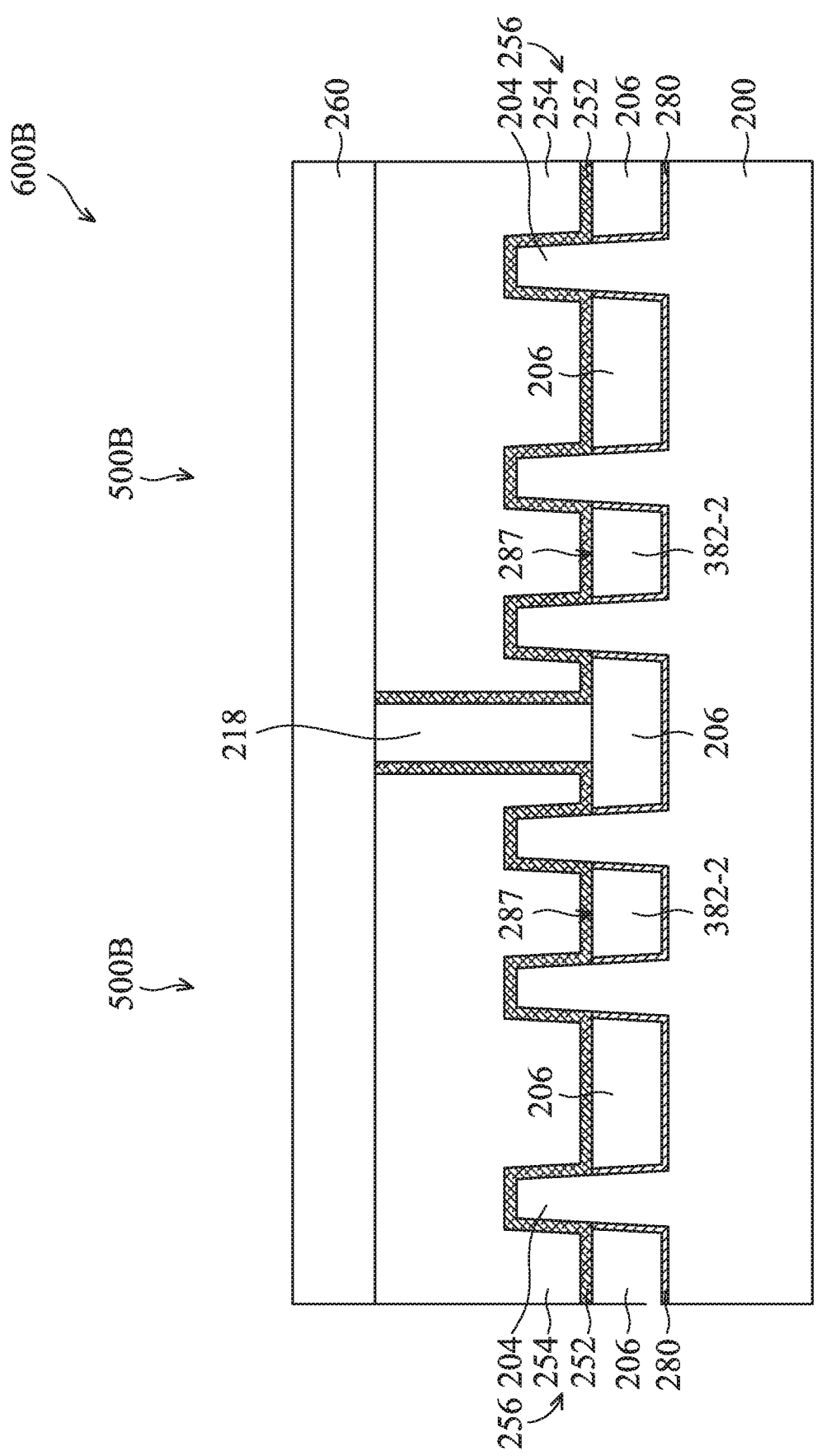
FIG. 17B is a cross-sectional view along line A-A' of FIG. 17A showing various stages of a method of forming a semiconductor structure after performing the stage shown in FIG. 16, in accordance with some embodiments.
Figure 17C:
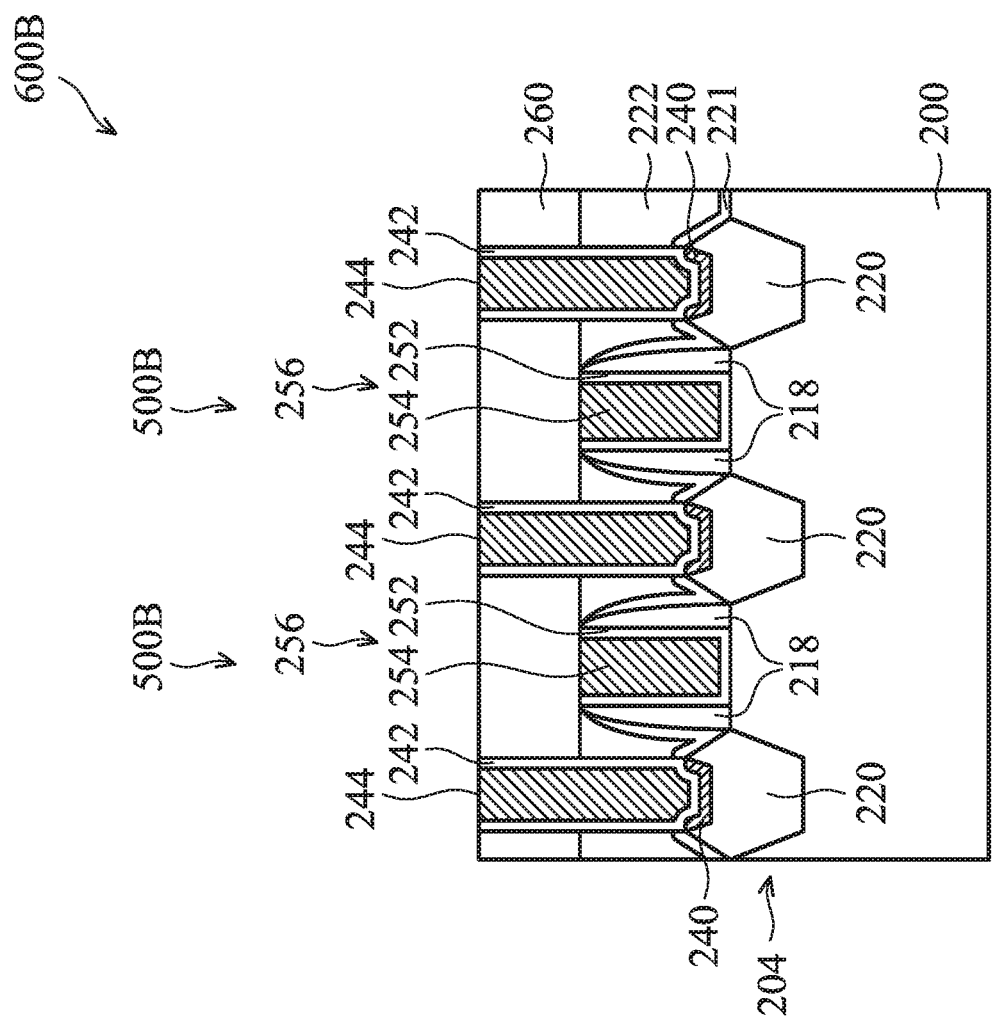
FIG. 17C is a cross-sectional view along line B-B' of FIG. 17A showing various stages of a method of forming a semiconductor structure after performing the stage shown in FIG. 16, in accordance with some embodiments.

Afterward, the patterned masks 210 are removed, and the insulation material 226 (FIG. 16) is recessed to form isolation structures 206, as shown in FIG. 16 in accordance with some embodiments. The isolation structures 206 are formed covering lower portions of the fin structures 204 and leaving upper portions of the fin structures 204 above the isolation structures 206. In addition, the etching process removes portions of the liner layer 280 over the upper portions of the fin structures 204. Furthermore, top surfaces of the isolation structures 206 maybe leveled with the top surfaces 383 of the first converted insulation material layers 382-2.

FIG. 17A is a perspective view to illustrate various stages of a process for forming the FinFETs 500B of the semiconductor structure 600B after performing the stage shown in FIG. 16. FIG. 17B is cross-sectional views along line A-A' of FIG. 17A to show various stages of a process for forming the FinFETs 500B of the semiconductor structure 600B after performing the stage shown in FIG. 16. FIG. 17C is cross-sectional views along line B-B' of FIG. 17A to show various stages of a process for forming the FinFETs 500B of the semiconductor structure 600B after performing the stage shown in FIG. 16. In some embodiments, the processes shown in FIGS. 17A, 17B and 17C are performed for both the PMOS region and the NMOS region, with some materials (e.g. dopants for source/drain regions, or work function layers of metal gates) adjusted to suit the type of devices (e.g. P-type FinFETs or N-type FinFETs) formed in the respective regions.

Afterward, processes similar to, or the same as, the processes shown in FIG. 10, FIG. 11A, FIG. 11B and FIG. 11C are performed to form the metal gate structures 256, the gate spacers 218, the source/drain structures 220, the contact etch stop layer (CESL) 221, the inter-layer dielectric (ILD) layers 222 and 260, the glue layers 242 and the contact plugs 244, as shown in FIGS. 17A, 17B and 17C in accordance with some embodiments. The metal gate structures 256 are formed over the fin structures 204. For example, the gate spacers 218 may be formed on opposite sidewalls of the metal gate structures 256. The source/drain structures 220 may be positioned in the fin structure 204 and on opposites of the metal gate structures 256. In some embodiments, the adjacent source/drain structures 220 on the inwardly bent fin structures 204 may be merged. The contact etch stop layer (CESL) 221 may be conformally deposited over the source/drain structures 220 and the gate spacers 218. The inter-layer dielectric (ILD) layers 222 and 260 may be formed overlying the CESL 221 and the first converted insulation material layer 382-2. The source/drain silicide layers 240 may be formed on the source/drain structures 220. The glue layers 242 and the contact plugs 244 may be formed passing through the ILD layers 222 and 260 and connecting the source/drain structures 220.

After performing the aforementioned processes, the FinFETs 500B are formed over the fin structure 204. Moreover, a semiconductor structure 600B including the FinFET 500B (e.g. the P-type FinFET or the N-type FinFET) is formed, as shown in FIGS. 17A, 17B and 17C in accordance with some embodiments.

Figure 12:
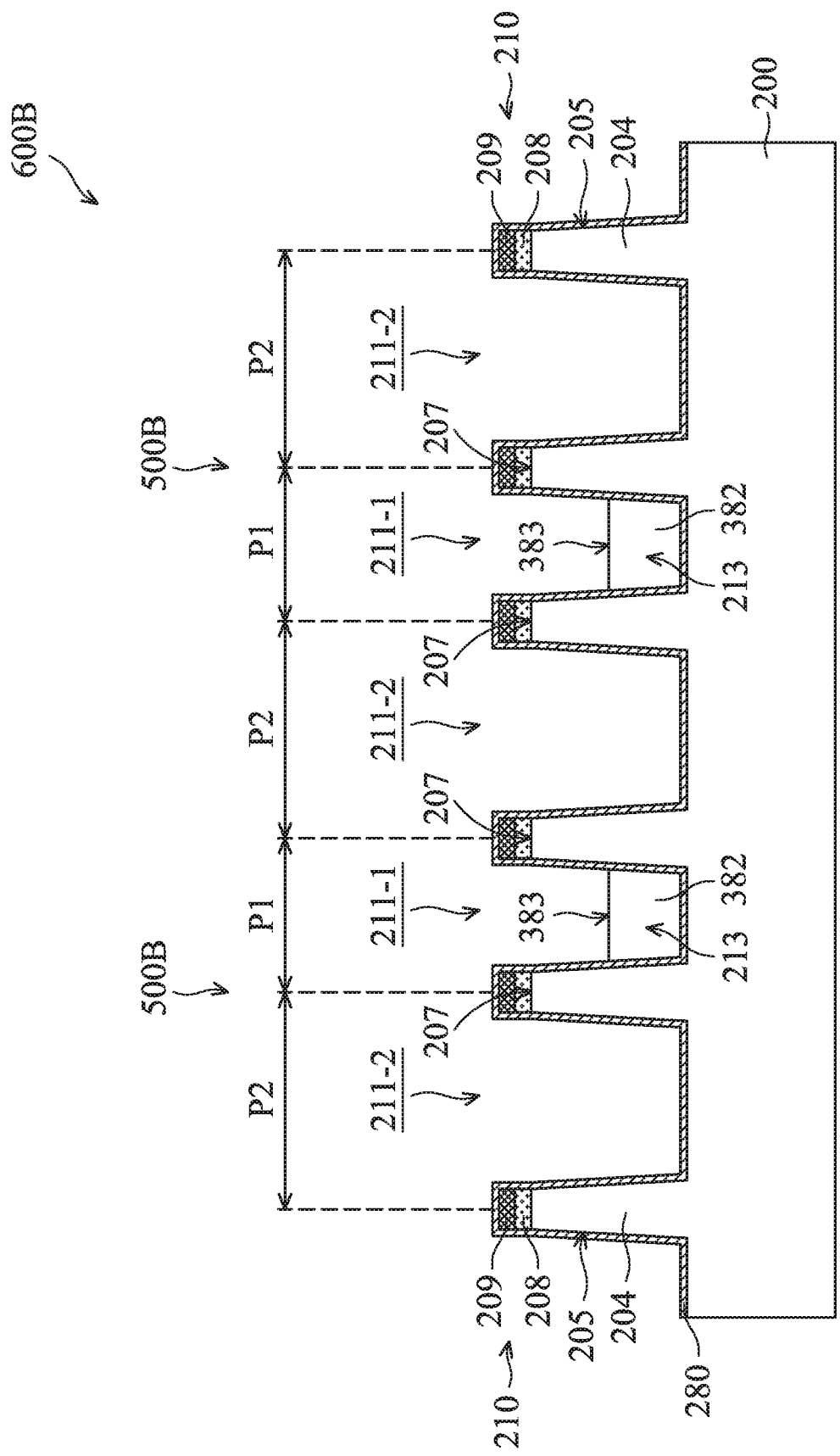
FIG. 12, FIG. 13, FIG. 14, FIG. 15 and FIG. 16 are cross-sectional views showing various stages of a method of forming a semiconductor structure, in accordance with some embodiments.

In some embodiments, the semiconductor structure 600B uses the first converted insulation material layer 382-2 to apply an inward force (compressive stress) to adjacent fin structures 204 of the semiconductor structure 600B arranged beside the trenches with a small spacing (e.g., arranged beside the trenches 211-1) by the processes shown in FIG. 12, FIG. 13 and FIG. 14 (including the FCVD process of the insulation material, the $O_3$ pre-treatment process and the insulation material conversion process). The inwardly bent fin structures 204 may facilitate to form the merged source/drain structures 220 of the FinFETs 500B. The merged source/drain structures may help to reduce the resistance of the contact plug. The device performance may be improved.

FIG. 18, FIG. 19, FIG. 20, FIG. 21, FIG. 22 and FIG. 23 are cross-sectional views taken along the longitudinal direction (the channel length direction of a FinFET) of the fin structure 204 and show various stages of a method of forming a semiconductor structure 600C, in accordance with some embodiments. FIG. 24A is a perspective view showing various stages of a process of forming a semiconductor structure 600C after performing the stage shown in FIG. 23. FIG. 24B is a cross-sectional view along line A-A' of FIG. 24A showing various stages of a process of forming a semiconductor structure 600C after performing the stage shown in FIG. 23. FIG. 24C is a cross-sectional view along line B-B' of FIG. 24A showing various stages of a process of forming a semiconductor structure 600C after performing the stage shown in FIG. 23.

Figure 18:
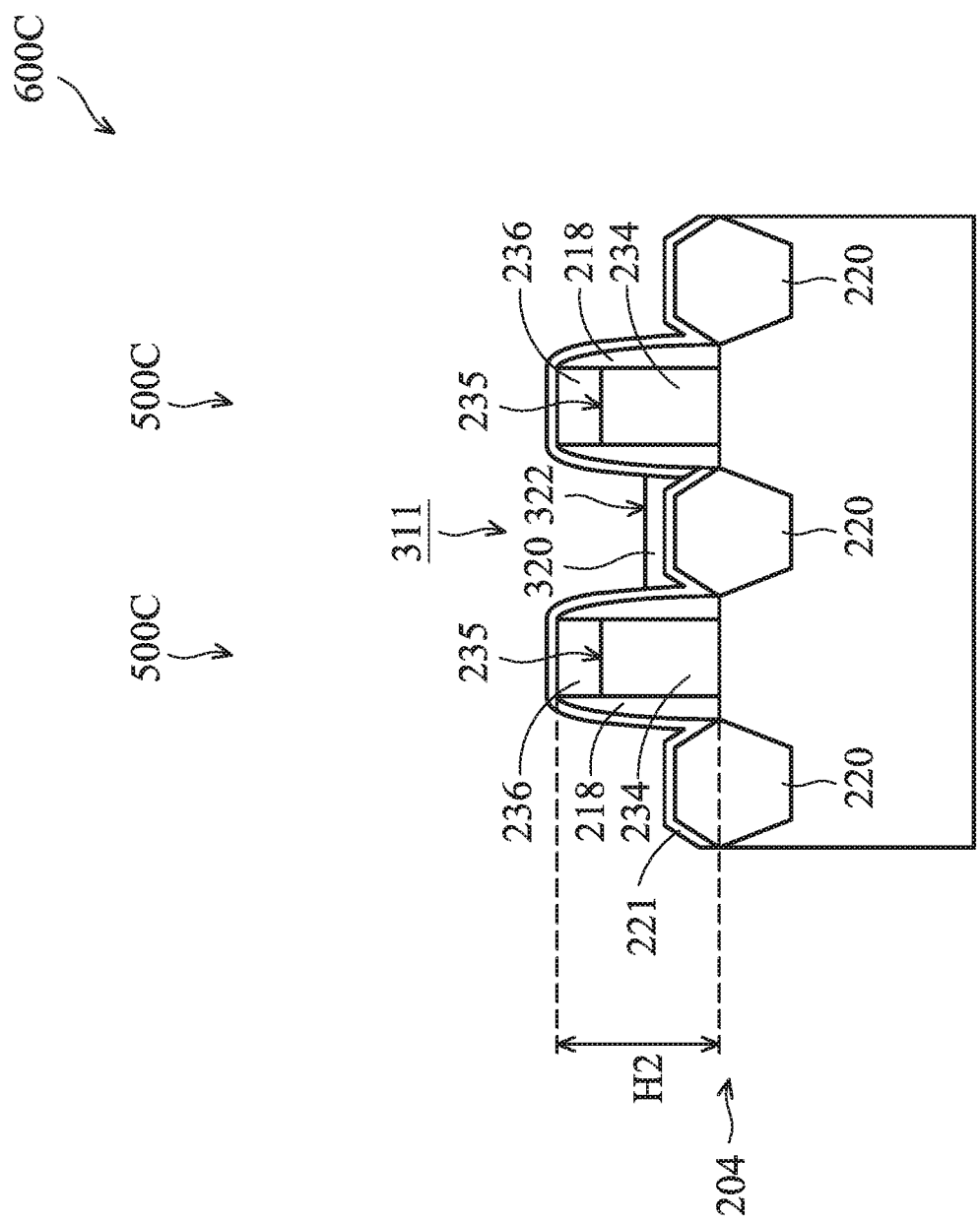
FIG. 18, FIG. 19, FIG. 20, FIG. 21, FIG. 22 and FIG. 23 are cross-sectional views showing various stages of a method of forming a semiconductor structure, in accordance with some embodiments.

The substrate 200 including the fin structure 204 is received, as shown in FIG. 18 in accordance with some embodiments. A lower portion of the fin structure 204 is surrounded by the isolation structures (e.g., the isolation structures 206 shown in FIGS. 24A and 24B), and an upper portion of the fin structure 204 protrudes from the isolation structures.

Afterward, the dummy gate structures 234, the gate spacers 218, the source/drain structures 220 and the contact etch stop layer (CESL) 221 are formed on the fin structure 204, as shown in FIG. 18 in accordance with some embodiments. The materials, configurations, structures and/or processes of the dummy gate structures 234, the gate spacers 218, the source/drain structures 220 and the contact etch stop layer (CESL) 221 of the semiconductor structure 600C may be similar to, or the same as, those of the semiconductor structure 600A (or 600B), and the details thereof are not repeated herein.

In some embodiments, the dummy gate structures 234 are spaced apart from each other by a gap 311, as shown in FIG. 18 in accordance with some embodiments. For example, a distance of the gap 311 may be equal to the minimum (critical) spacing between the adjacent two dummy gate structures 234 defined in the design rule.

Afterward, an insulation material layer 320 is formed filling a bottom portion of the gap 311 between the adjacent two dummy gate structures 234 over the fin structure 204 by a flowable CVD process, as shown in FIG. 18 in accordance with some embodiments. Because the gap 311 may have a high aspect ratio, the insulation material layer 320 may be deposited to fill the gap 311 prior than a region outside the dummy gate structures 234 by the flowable CVD process. Therefore, the insulation material layer 320 may fill a portion of the gap 311 by controlling the process time of the flowable CVD process. For example, a top surface 322 of each of the insulation material layers 320 may be positioned lower than the top surfaces 235 of the dummy gate structures 234. In some embodiments, the top surface 322 of each of the insulation material layers 320 may be positioned between the top surfaces 235 of the dummy gate structures 234 and the bottom surfaces of the dummy gate structure 234 (leveled with the top surface 207 of the fin structure 204 (FIG. 1)). For example, the top surface 322 of each of the insulation material layers 320 may be positioned between about one-third to about a quarter of the total height H2 of the dummy gate structures 234 and the mask pattern 236.

In some embodiments, the materials and/or processes of the insulation material layer 320 may be similar to, or the same as, those of the first insulation material layer 282 shown in FIG. 2. For example, the insulation material layer 320 may be formed of, for example, silicon dioxide formed by a flowable CVD process.

Figure 19:
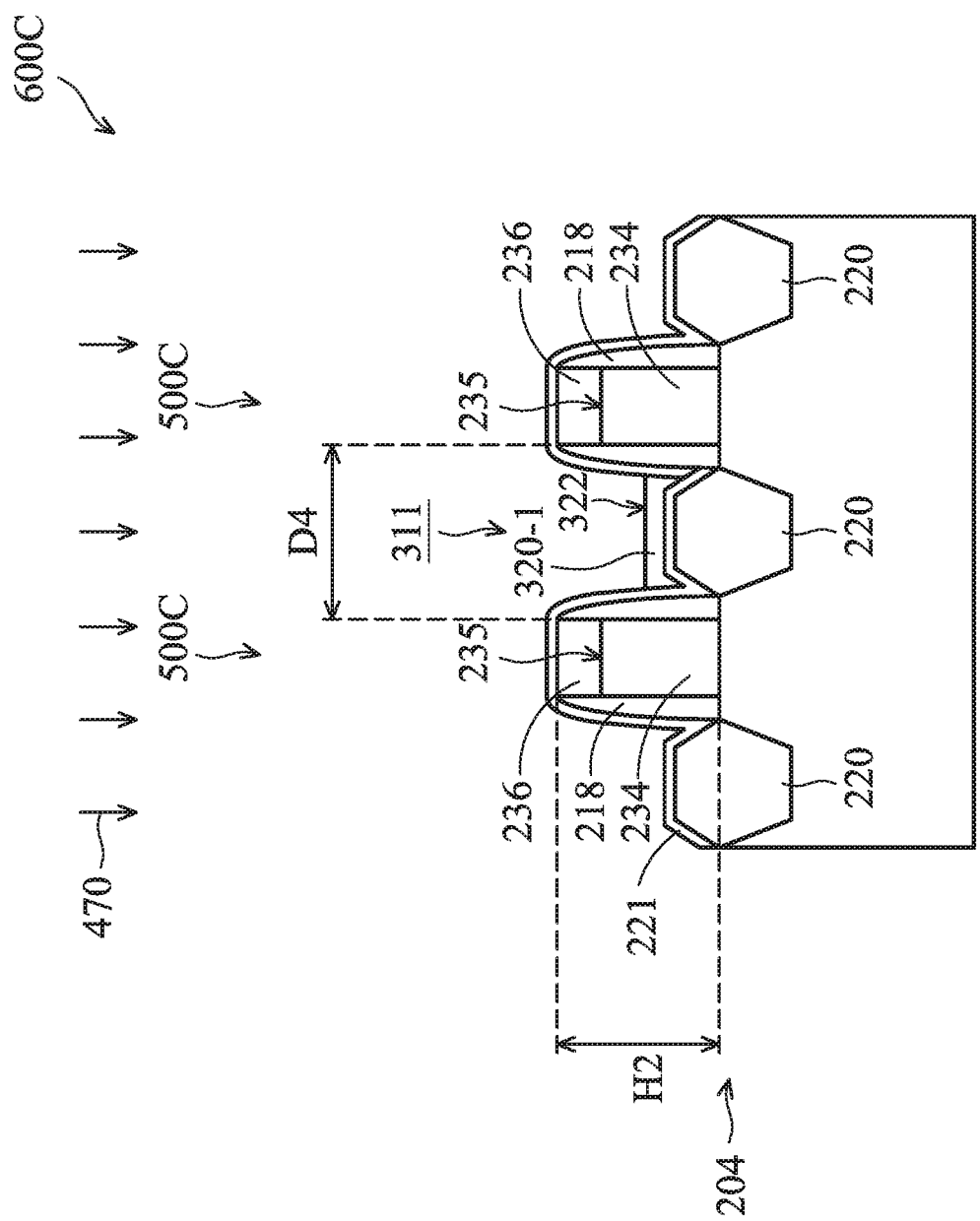

Afterwards, the pre-treatment process 470, for example, an $O_3$ pre-treatment process, is performed on the insulation material layer 320 (FIG. 18) to form a treated insulation material layer 320-1, as shown in FIG. 19 in accordance with some embodiments. The pre-treatment process 470 may be performed to partially break the Si—N bond and Si—H bond in the insulation material layer 320. In addition, the pre-treatment process 470 may convert Si—N bond and Si—H bond into Si—O bond. Therefore, Si—O bond is formed in the treated insulation material layer 320-1 after performing the pre-treatment process 470. The volume of the treated insulation material layer 320-1 may be equal to the volume of the insulation material layer 320 after performing the pre-treatment process 470.

Figure 20:
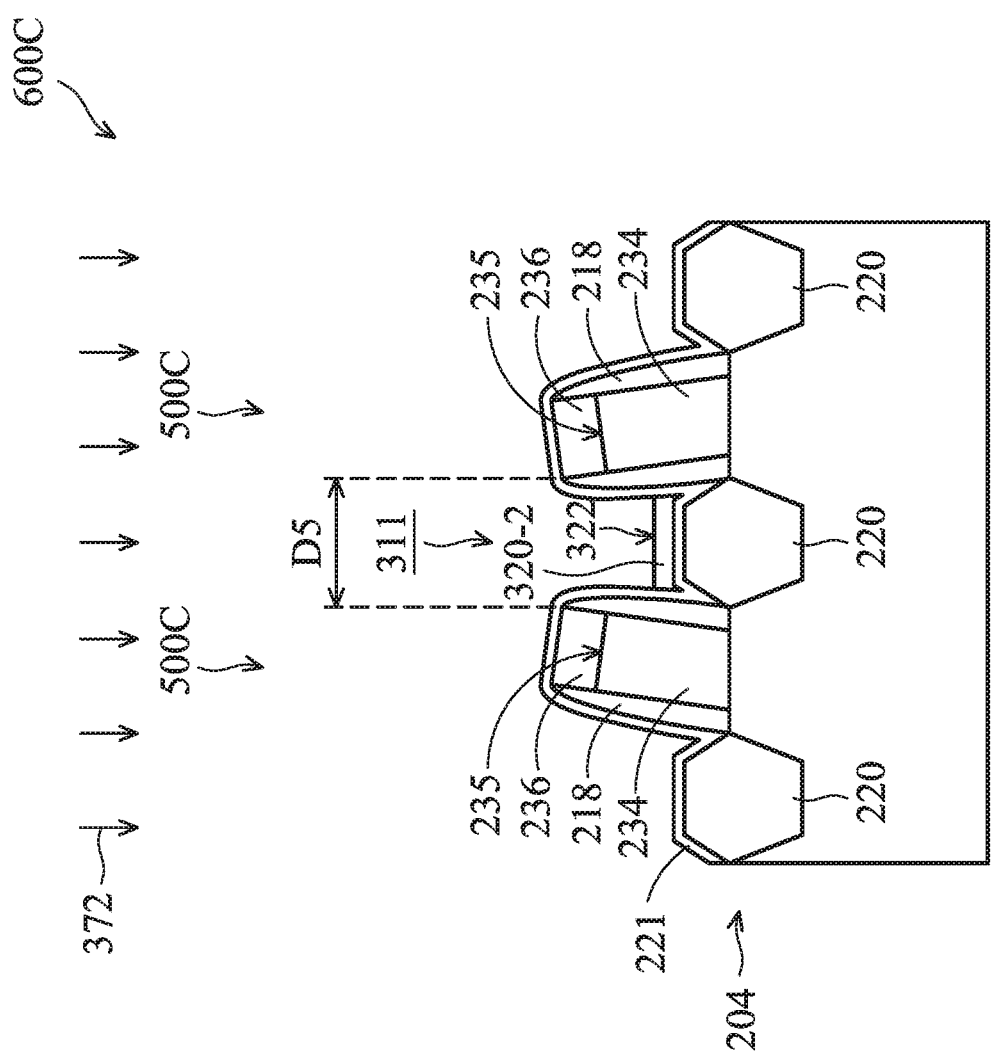

Afterwards, the insulation material conversion process 372 is performed on the treated insulation material layer 320-1 (FIG. 19), as shown in FIG. 20 in accordance with some embodiments. The insulation material conversion process 372 may help to break the remaining Si—N bond and Si—H bond in the second insulation material layer 286. In addition, the insulation material conversion process 372 may convert Si—N bond and Si—H bond into Si—O bond. Therefore, the treated insulation material layer 320-1 may be converted into a converted insulation material layer 320-2 after performing the insulation material conversion process 372. In addition, Si—O bond is formed in the converted insulation material layer 320-2. The converted insulation material layer 320-2 may have a densified structure and a shrunk volume.

After performing the insulation material conversion process 372, the converted insulation material layer 320-2 may apply a compressive stress to the adjacent dummy gate structures 234, as shown in FIG. 20 in accordance with some embodiments. Because the top surface 322 of each of the insulation material layers 320 (FIG. 18) may be positioned between about one-third to about a quarter of the total height H2 of the dummy gate structures 234 and the mask pattern 236. The gap 311 may have enough space to allow upper portions of the adjacent dummy gate structures 234 bent inwardly by the compressive stress induced from the converted insulation material layer 320-2. In some embodiments, a distance D4 (FIG. 18) between upper portions of the adjacent dummy gate structures 234 before performing the insulation material conversion process 372 is different from a distance D5 (FIG. 20) between upper portions of the adjacent dummy gate structures 234 after performing the insulation material conversion process 372. For example, the distance D5 is less than the distance D4.

Figure 21:
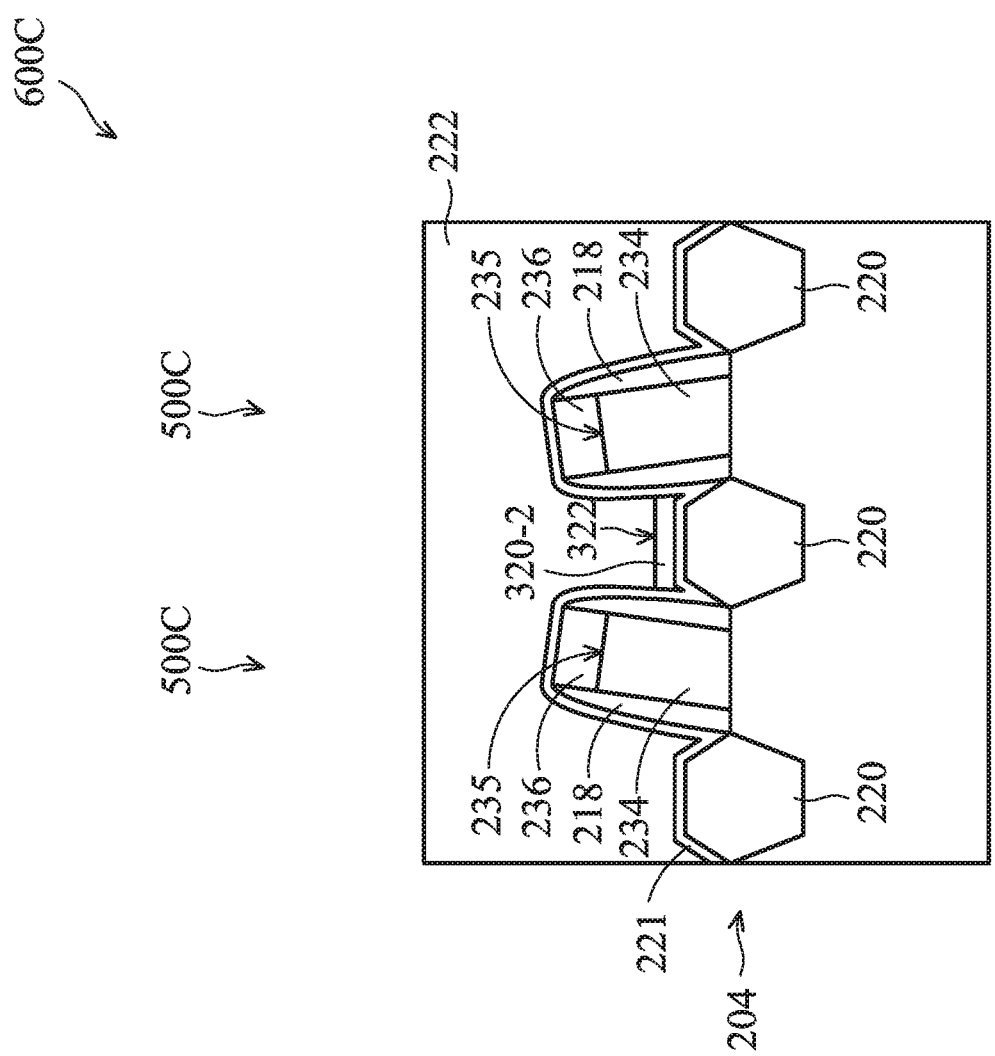

Afterward, an interlayer dielectric (ILD) layer (e.g., a first ILD layer) 222 is formed over the fin structure 204, as shown in FIG. 21 in accordance with some embodiments. The ILD layer 222 may be formed by depositing a flowable dielectric material over the CESL 221 and the converted insulation material layer 320-2. For example the ILD layer 222 may be positioned overlying the converted insulation material layer 320-2. Therefore, the converted insulation material layer 320-2 may be positioned between and surrounded by the CESL 221 and the ILD layer 222. In addition, the flowable dielectric material may fill gaps 311 (FIG. 20) between the dummy gate structures 234. The deposition of the flowable dielectric material may have ability to fill small trenches and gaps between structures with high aspect ratios. In some embodiments, the deposition of the flowable dielectric material includes introducing a silicon-containing compound and an oxygen-containing compound. The silicon-containing compound and oxygen-containing compound react to form a flowable dielectric material, thereby filling the trenches. The ILD layer 222 may be formed of a dielectric material such as phosphosilicate glass (PSG), borosilicate glass (BSG), boron-doped phosphosilicate glass (BPSG), undoped silicate glass (USG), or the like, and may be deposited by any suitable method, such as CVD, PECVD, or FCVD. In some embodiments, the converted insulation material layer 320-2 and the ILD layer 222 are formed of different materials.

Figure 22:
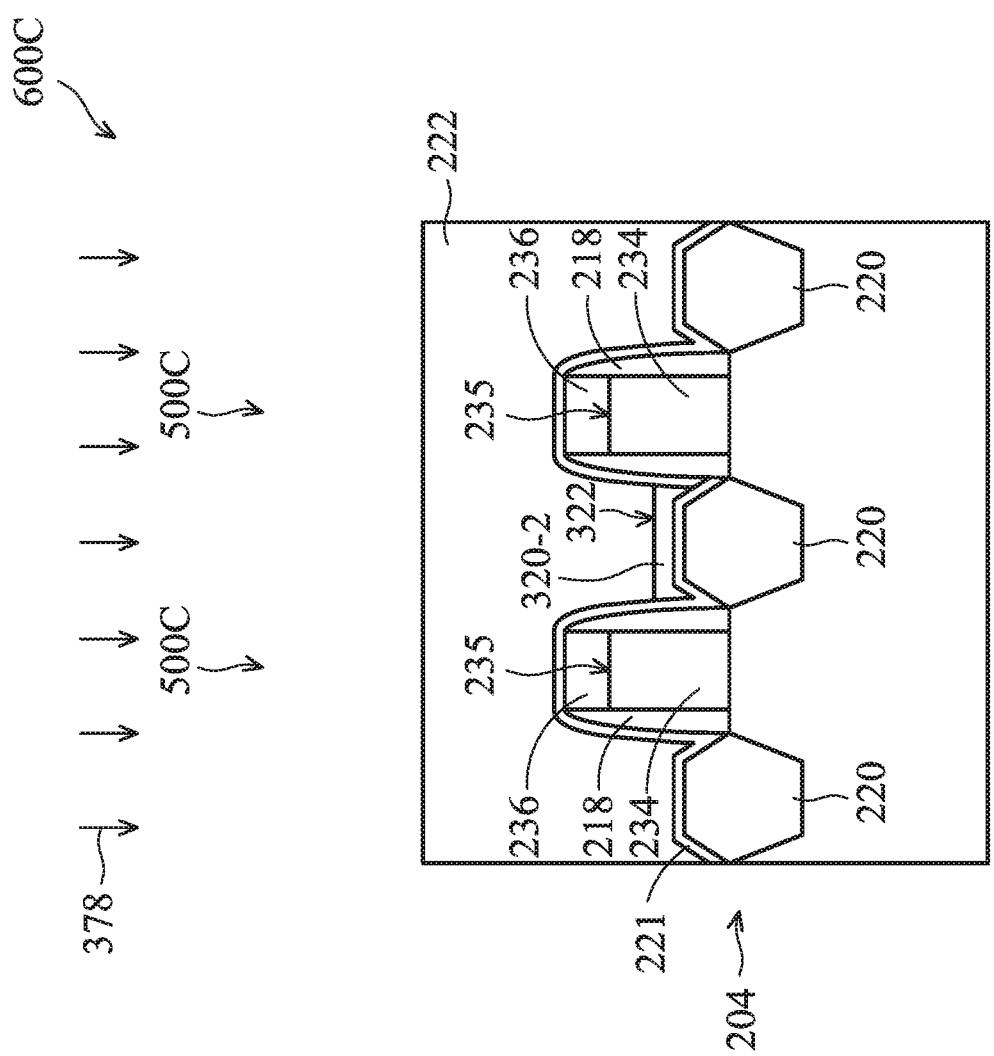

Afterward, an anneal process 378 is performed to treat (densify) the ILD layer 222, as shown in FIG. 22 in accordance with some embodiments. The anneal process 378 may convert the flowable dielectric material, at least partially, to a dense oxide material in the ILD layer 222. In some embodiments, the anneal process 378 includes a wet steam anneal process (e.g., a thermal anneal process performed in an environment including water steam) performed at a temperature in a range from about 500° C. to about 700° C., for a duration of about two hours to about three hours. For example, oxygen comes from the wet steam used during the wet steam anneal process may help the oxidation of the ILD layer 222.

In the commonly used gate-replacement process, the densify process (i.e. the anneal process 378) of the ILD layer (i.e. the ILD layer 222) may apply a tensile stress to the gate spacers of the adjacent dummy gate structures, which are arranged separated each other by the gap (e.g., the gap 311) with a high aspect ratio. Therefore, the gate spacers may be bent outwardly to the gaps (not shown), which are configured to accommodate the subsequent metal gate structures, after the removal of the dummy gate structures. The outward bent gate spacers may result the gaps with a narrow width. Therefore, the metal gate structures (e.g., the metal gate structures 256) are difficult to form filling the gaps between the gate spacers. To solve the aforementioned problem, the processes shown in FIGS. 18-20 (including the FCVD process of the insulation material, the O₃ pre-treatment process and the insulation material conversion process) may be adopted to form the converted insulation material layer 320-2. The converted insulation material layer 320-2 may apply an inward bending force (compressive stress) to the adjacent gate spacers before forming the ILD layer. The inwardly bent gate spacers 218 (e.g., the gate spacers 218 spaced apart from each other by the gap 311 shown in FIG. 20) may be bent outwardly by the densified ILD layer 222 after performing the anneal process 378 (FIG. 22). Therefore, the gate spacers 218 may stand upright and facilitate the filling of the subsequent metal gate structures 256 (FIG. 23) in accordance with some embodiments.

In some embodiments, the distance D5 (FIG. 20) between upper portions of the adjacent dummy gate structures 234 before performing the anneal process 378 is different from a distance D6 (FIG. 22) between the upper portions of the adjacent fin structures 204 after performing the anneal process 378. For example, the distance D6 may be greater than the distance D5. In addition, the distance D4 (FIG. 18) between upper portions of the adjacent fin structures 204 before performing the insulation material conversion process 372 may be equal to the distance D6 (FIG. 22) between the upper portions of the adjacent fin structures 204A after performing the anneal process 378.

Figure 23:
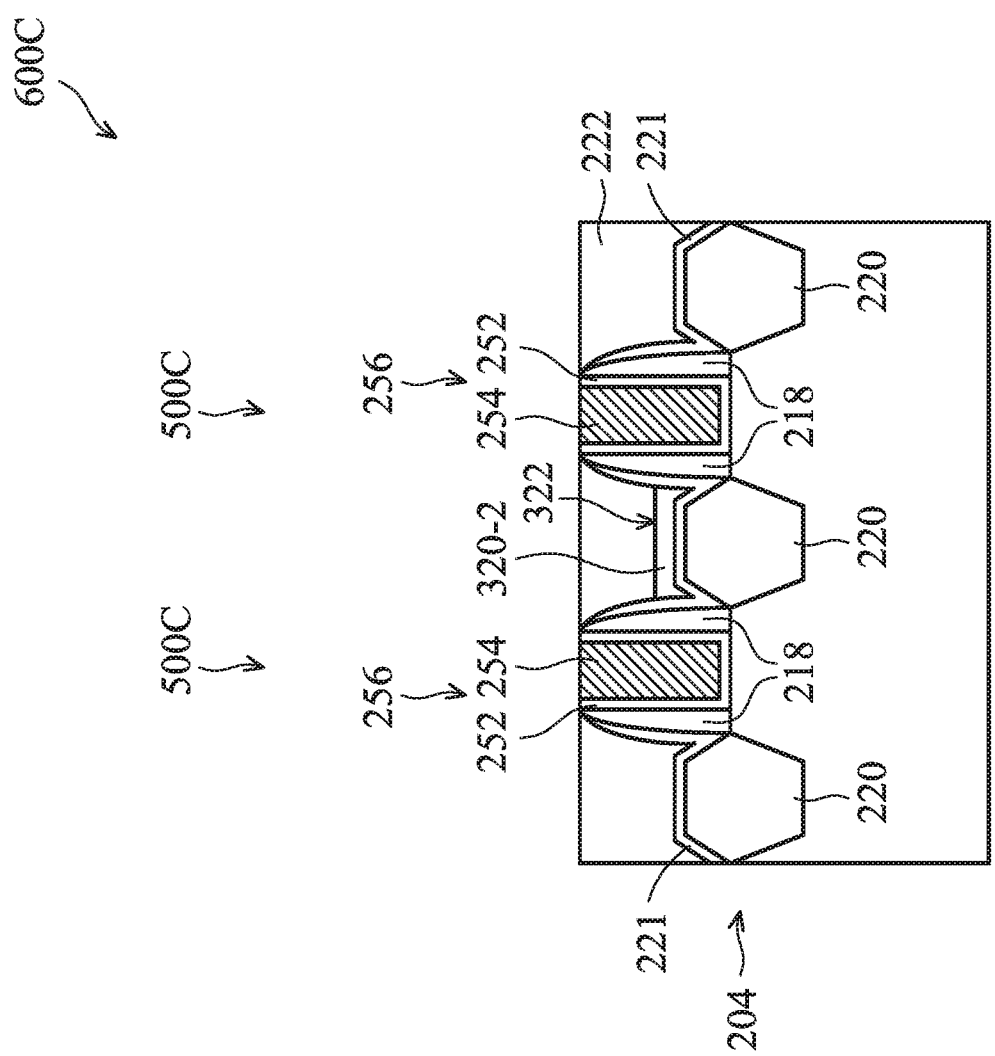
Figure 24A:
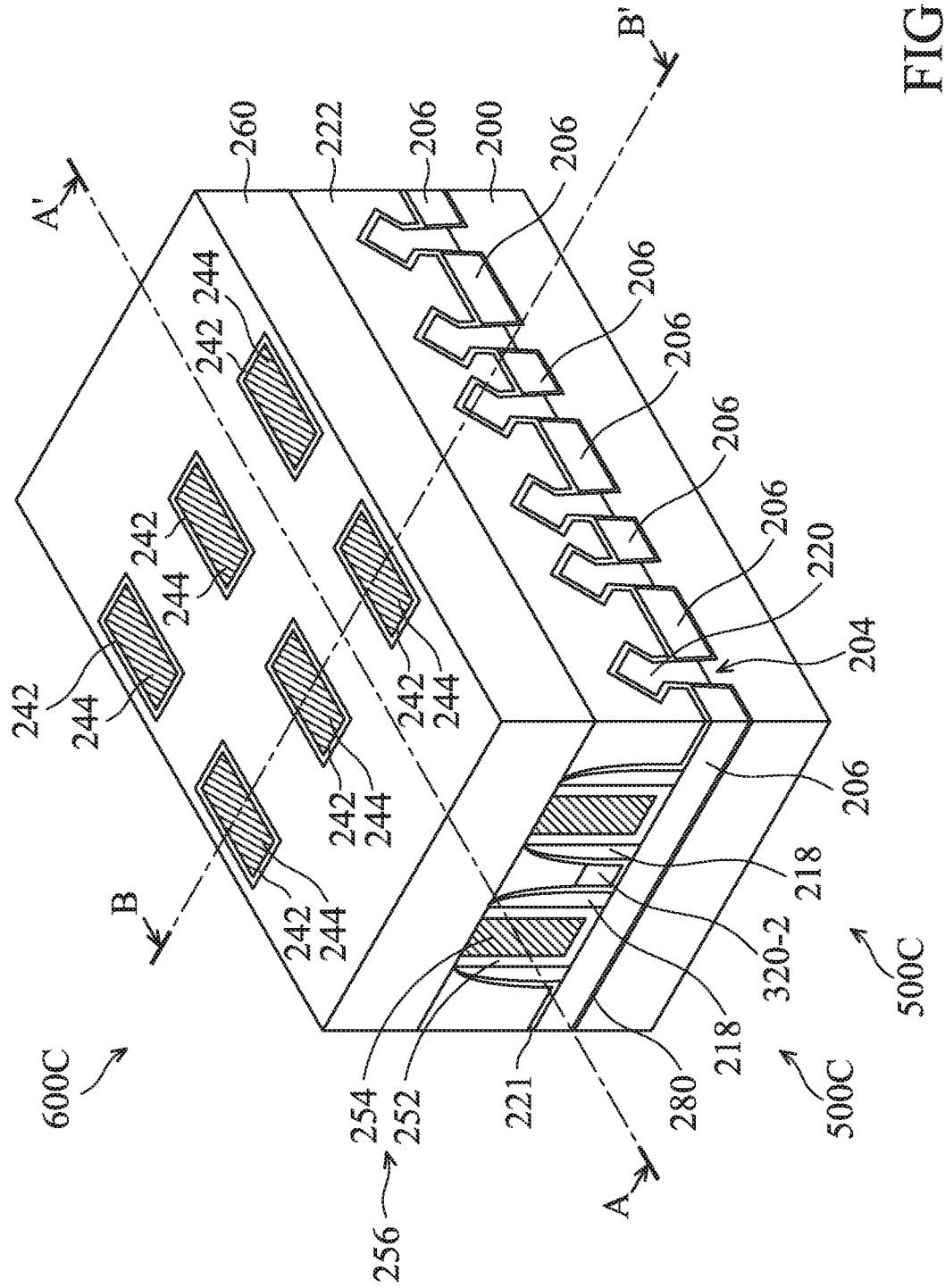
FIG. 24A is a perspective view of a fin field-effect transistor (FinFET) structure showing various stages of a method of forming a semiconductor structure after performing the stage shown in FIG. 23, in accordance with some embodiments.
Figure 24B:
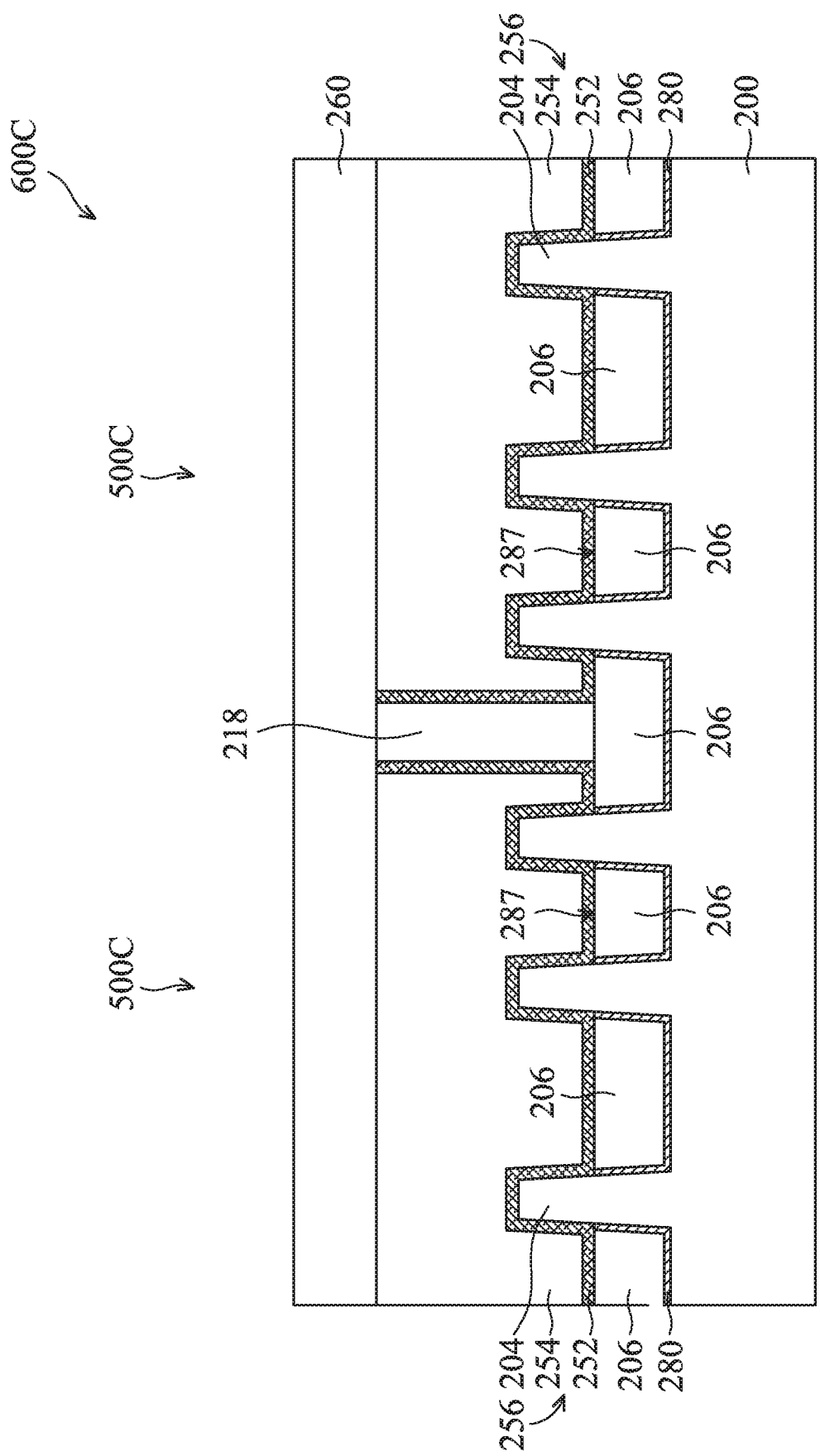
FIG. 24B is a cross-sectional view along line A-A' of FIG. 24A showing various stages of a method of forming a semiconductor structure after performing the stage shown in FIG. 23, in accordance with some embodiments.
Figure 24C:
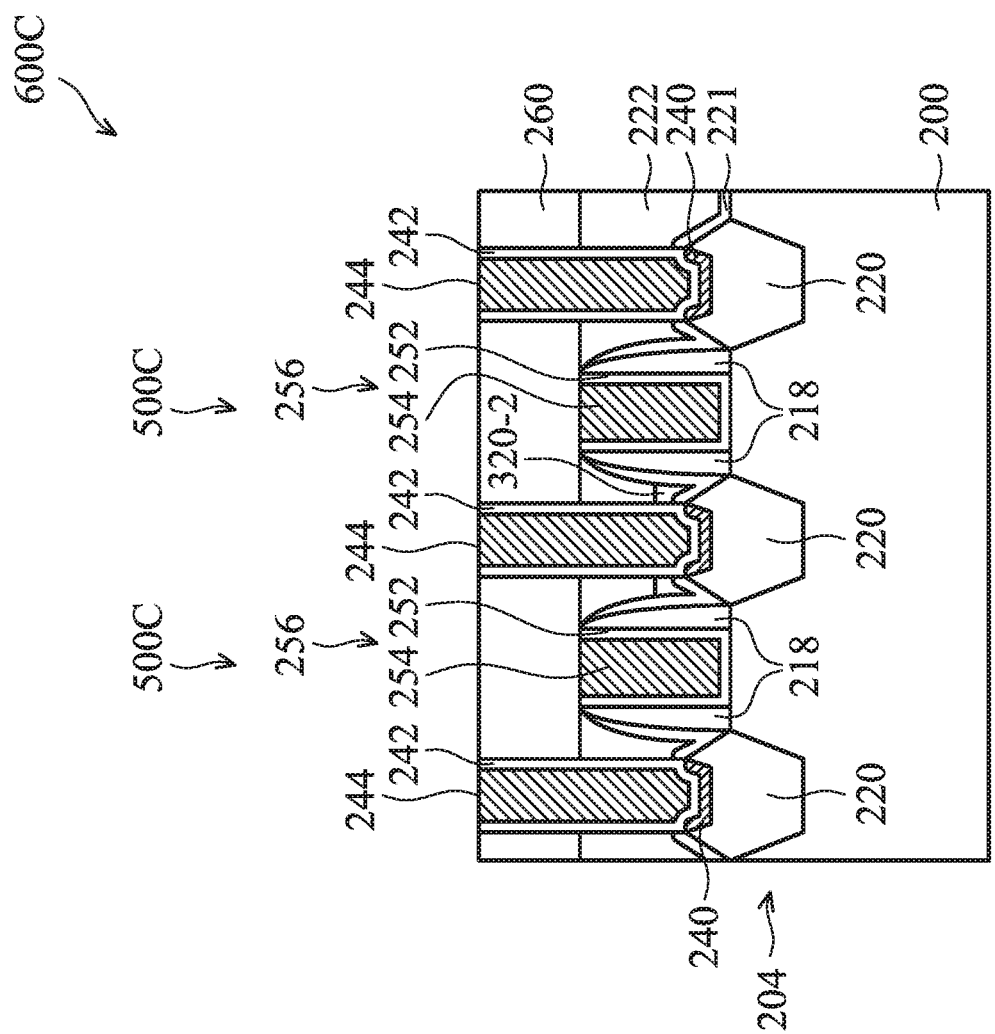
FIG. 24C is a cross-sectional view along line B-B' of FIG. 24A showing various stages of a method of forming a semiconductor structure after performing the stage shown in FIG. 23, in accordance with some embodiments.

Afterward, the metal gate structures 256 are formed to respectively replace the dummy gate structures 234 by the gate-replacement process, as shown in FIG. 23 in accordance with some embodiments. For example, the gate-replacement process may include a removal process, a deposition processes and a subsequent planarization process. Each of the metal gate structures 256 may include the gate dielectric layer 252 and the gate electrode layer 254 over the gate dielectric layer 252. The source/drain structures 220 may be positioned adjacent to the metal gate structures 256. In some embodiments, the gate spacers 218 are positioned on opposite sidewall surfaces 255 of the metal gate structure 256.

FIG. 24A is a perspective view to illustrate various stages of a process for forming the FinFETs 500C of the semiconductor structure 600C after performing the stage shown in FIG. 23. FIG. 24B is cross-sectional views along line A-A' of FIG. 24A to show various stages of a process for forming the FinFETs 500C of the semiconductor structure 600C after performing the stage shown in FIG. 23. FIG. 24C is cross-sectional views along line B-B' of FIG. 24A to show various stages of a process for forming the FinFETs 500C of the semiconductor structure 600C after performing the stage shown in FIG. 23. In some embodiments, the processes shown in FIGS. 24A, 24B and 24C are performed for both the PMOS region and the NMOS region, with some materials (e.g. dopants for source/drain regions, or work function layers of metal gates) adjusted to suit the type of devices (e.g. P-type FinFETs or N-type FinFETs) formed in the respective regions.

Afterward, processes similar to, or the same as, the processes shown in FIGS. 11A, 11B and 11C are performed to form the ILD layer 260, the source/drain silicide layers 240, the glue layers 242 and the contact plugs 244, as shown in FIGS. 24A, 24B and 24C in accordance with some embodiments. For example, the ILD layer 260 may be formed over the ILD layer 222. The source/drain silicide layers 240 may be formed on the source/drain structures 220. The glue layers 242 and the contact plugs 244 between the metal gate structures 256 may be formed passing through the ILD layer 260, the ILD layer 222 and the converted insulation material layer 320-2. The glue layers 242 and the contact plugs 244 may connect the source/drain structures 220. In addition, the contact plug 244 between the metal gate structures 256 may surrounded by the ILD layer 260, the ILD layer 222 and the converted insulation material layer 320-2.

After performing the aforementioned processes, the FinFETs 500C are formed over the fin structure 204. Moreover, a semiconductor structure 600C including the FinFETs 500C (e.g. the P-type FinFET or the N-type FinFET) is formed, as shown in FIGS. 24A, 24B and 24C in accordance with some embodiments.

In some embodiments, the semiconductor structure 600C uses the converted insulation material layer 320-2 to apply the inward bending force (the compressive stress) to the adjacent gate spacers 218 before forming the ILD layer 222. The inwardly bent gate spacers 218 may be bent outwardly by the densified ILD layer 222 after performing the anneal process 378. Therefore, the gate spacers 218 may stand upright and facilitate the filling of the subsequent metal gate structures 256 and enlarge the window for the metal gate filling process. The device's performance may be improved.

As described previously, a method for forming a semiconductor structure (e.g. the semiconductor structures 600A and 600B) includes forming a first insulation material layer (e.g., the first insulation material layers 282 and 382) in a portion of a trench (e.g., the trenches 211-1) between a first fin structure and a second fin structure (e.g., the adjacent fin structures beside the trenches 211-1) protruding from a substrate (e.g., the substrate 200). The method includes performing a pre-treatment process (e.g., the pre-treatment processes 370 and 470) and an insulation material conversion process (e.g., the insulation material conversion process 372) on the first insulation material layer. The first insulation material layer subjected to the insulation material conversion process may apply a stress (e.g., the compressive stress or the tensile stress) to the adjacent fin structures beside the trenches. Therefore, a first distance (e.g., the distance D1) between upper portions of the first fin structure and the second fin structure before performing the insulation material conversion process is different from a second distance (e.g., the distance D2) between the upper portions of the first fin structure and the second fin structure after performing the insulation material conversion process. The outwardly bent or inwardly bent fin structures may help to re-shape the fin structure after the processes of the STI structures. For example, the outwardly bent fin structures may facilitate the filling of the subsequent dummy gate material or metal gate material and enlarges the window for the gate filling process. The inwardly bent fin structures may facilitate to form the merged source/drain structures of the FinFETs. The device performance may be improved.

As described previously, a method for forming a semiconductor structure (e.g., the semiconductor structure 600C) includes forming an insulation material layer (e.g., the insulation material layer 320) between a first gate structure and a second gate structure (e.g., the dummy gate structures 234 and the metal gate structures 256) over a fin structure (e.g., the fin structure 204). The method further includes performing a pre-treatment process (e.g., the pre-treatment process 470) on the insulation material layer. The method further includes performing an insulation material conversion process (e.g., the insulation material conversion process 372) on the insulation material layer. The insulation material layer subjected to the insulation material conversion process may apply a compressive stress to the adjacent gate spacers (e.g. the gate spacers 218) before forming the ILD layer. Therefore, a first distance (e.g., the distance D4) between upper portions of the first gate structure and the second gate structure before performing the insulation material conversion process is different from a second distance (e.g., the distance D5) between upper portions of the first gate structure and the second gate structure after performing the insulation material conversion process. The inwardly bent gate spacers may be bent outwardly by the anneal process (e.g., the anneal process 378) of the ILD layer. Therefore, the gate spacers may stand upright and facilitate the filling of the subsequent metal gate structures 256 (e.g., the metal gate structures 256) and enlarge the window for the metal gate filling process.

Embodiments of a semiconductor structure and a method for forming the same are provided. The method for forming a semiconductor structure includes forming a first insulation material layer in a portion of a trench between a first fin structure and a second fin structure protruding from a substrate. The method includes performing a pre-treatment process on the first insulation material layer. The method further includes performing a first insulation material conversion process on the first insulation material layer. A first distance between upper portions of the first fin structure and the second fin structure before performing the first insulation material conversion process is different from a second distance between the upper portions of the first fin structure and the second fin structure after performing the first insulation material conversion process. The method further includes forming trench isolation structures covering the first insulation material layer in the trench. The pre-treatment process and the first insulation material conversion process performed on the first insulation material layer before the process of the STI structures may facilitate the filling of the gate material or the formation of the merged source/drain structures. The device performance may be improved.

In some embodiments, a method for forming a semiconductor structure is provided. The method includes forming a first insulation material layer in a portion of a trench between a first protruding structure and a second protruding structure over a substrate and performing a pre-treatment process on the first insulation material layer. The method further includes performing a first insulation material conversion process on the first insulation material layer and forming a second insulation material layer covering the first insulation material layer in the trench. In addition, a first distance between upper portions of the first protruding structure and the second protruding structure before performing the first insulation material conversion process is different from a second distance between the upper portions of the first protruding structure and the second protruding structure after performing the first insulation material conversion process In some embodiments, a method for forming a semiconductor structure is provided. The method includes forming a first protruding structure, a second protruding structure, and a third protruding structure over a substrate and performing a depositing process to form a first insulation material layer between the first protruding structure and the second protruding process but not between the second protruding structure and the third protruding process. The method further includes performing an insulation material conversion process onto the first insulation material layer to bend the first protruding structure and the second protruding structure toward opposite directions and forming a second insulation material layer over the first insulation material layer and between the second protruding structure and the third protruding structure. The method further includes performing a second insulation material conversion process onto the second insulation material layer. In addition, a distance between the first protruding structure and the second protruding structure is smaller than a distance between the second protruding structure and the third protruding structure.

In some embodiments, a method for forming a semiconductor structure is provided. The method for forming a semiconductor structure includes forming a first protruding structure over a substrate, and the first protruding structure has a first sidewall extending along a first direction. The method further includes forming a first insulation material layer over a bottom portion of the first sidewall of the first protruding structure and performing a first insulation material conversion process on the first insulation material layer to bend the first sidewall of the first protruding structure, so that the first sidewall of the first protruding structure extends along a second direction different from the first direction.

In some embodiments, a method for forming a semiconductor structure is provided. The method includes forming a first protruding structure, a second protruding structure, and a third protruding structure over a substrate. The method also includes performing a depositing process to form a first insulation material layer between the first protruding structure and the second protruding structure but not between the second protruding structure and the third protruding structure. The method further includes performing a first insulation material conversion process onto the first insulation material layer to bend the first protruding structure and the second protruding structure toward opposite directions. In some embodiments, a method for forming a semiconductor structure is provided. The method includes forming a first protruding structure and a second protruding structure over a substrate. The method includes forming a first insulation material layer between the first protruding structure and the second protruding structure. A first sidewall of an upper portion of the first protruding structure and a second sidewall of an upper portion of the second protruding structure are not covered by the first insulation material layer. The method further includes performing a first insulation material conversion process on the first insulation material layer to bend the first sidewall of the first protruding structure and the second sidewall of an upper portion of the second protruding structure.

In some embodiments, a method for forming a semiconductor structure is provided. The method includes forming a first gate and a second gate over a substrate, and forming a source/drain structure between the first gate and the second gate. The method includes forming a first insulation material layer over the source/drain structure; and performing a first insulation material conversion process on the first insulation material layer to bend the first gate and the second gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming a first protruding structure, a second protruding structure, and a third protruding structure over a substrate;
   performing a depositing process to form a first insulation material layer between the first protruding structure and the second protruding structure;
   performing a first insulation material conversion process onto the first insulation material layer to bend the first protruding structure and the second protruding structure toward opposite directions;
   forming a liner over the first protruding structure; and
   forming an oxide layer over the liner, wherein the oxide layer is between the liner and the first insulation material layer.

2. The method for forming the semiconductor structure as claimed in claim 1, wherein a first pitch is between the first protruding structure and the second protruding structure, a second pitch is between the second protruding structure and the third protruding structure, and the first pitch is smaller than the second pitch.

3. The method for forming the semiconductor structure as claimed in claim 1, wherein the first protruding structure and the second protruding structure are bent toward opposite directions during the first insulation material conversion process.

4. The method for forming the semiconductor structure as claimed in claim 1, wherein a sidewall of an upper portion of the first protruding structure is not covered by the first insulation material layer.

5. The method for forming the semiconductor structure as claimed in claim 1, further comprising:
   performing a pre-treatment process onto the first insulation material layer before the first insulation material conversion process is performed.

6. The method for forming the semiconductor structure as claimed in claim 5, wherein the pre-treatment process is an O3 treatment process.

7. The method for forming the semiconductor structure as claimed in claim 1, further comprising:

forming a second insulation material layer over the first insulation material layer and between the second protruding structure and the third protruding structure.

8. The method for forming the semiconductor structure as claimed in claim 1, further comprising:
forming a contact plug through the first insulation material layer.

9. The method for forming the semiconductor structure as claimed in claim 1, wherein the first protruding structure comprises a first gate structure, and the second protruding structure comprises a second gate structure.

10. A method for forming a semiconductor structure, comprising:
forming a first protruding structure and a second protruding structure over a substrate;
forming a first insulation material layer between the first protruding structure and the second protruding structure, wherein a first sidewall of an upper portion of the first protruding structure and a second sidewall of an upper portion of the second protruding structure are not covered by the first insulation material layer; and
performing a first insulation material conversion process on the first insulation material layer to bend the first sidewall of the first protruding structure and the second sidewall of an upper portion of the second protruding structure.

11. The method for forming the semiconductor structure as claimed in claim 10, further comprising:
forming a liner over the first protruding structure; and
forming an oxide layer over the liner, wherein the oxide layer is between the liner and the first insulation material layer.

12. The method for forming the semiconductor structure as claimed in claim 11, further comprising:
forming a pad oxide over a top surface of the first protruding structure, wherein the liner is formed on a sidewall of the pad oxide, but the first insulation material layer is not on the sidewall of the pad oxide.

13. The method for forming the semiconductor structure as claimed in claim 10, further comprising:
performing a pre-treatment process onto the first insulation material layer before the first insulation material conversion process is performed.

14. The method for forming the semiconductor structure as claimed in claim 10, further comprising:
forming a contact plug through the first insulation material layer.

15. A method for forming a semiconductor structure, comprising:
forming a first gate and a second gate over a substrate;
forming a source/drain structure between the first gate and the second gate;
forming a first insulation material layer over the source/drain structure; and
performing a first insulation material conversion process on the first insulation material layer to bend the first gate and the second gate.

16. The method for forming the semiconductor structure as claimed in claim 15, further comprising:
performing a pre-treatment process on the first insulation material layer before performing the first insulation material conversion process.

17. The method for forming the semiconductor structure as claimed in claim 16, wherein the pre-treatment process is an O3 treatment process.

18. The method for forming the semiconductor structure as claimed in claim 15, further comprising:
forming an etch stop layer over the source/drain structure, wherein the first insulation material layer covers a top surface of the etch stop layer.

19. The method for forming the semiconductor structure as claimed in claim 15, further comprising:
forming a contact plug through the first insulation material layer.

20. The method for forming the semiconductor structure as claimed in claim 1, further comprising:
forming a pad oxide on a top surface of the first protruding structure;
forming a second insulation material layer over the first insulation material layer, the pad oxide and between the second protruding structure and the third protruding structure; and
performing a second insulation material conversion process onto the second insulation material layer.

* * * * *